United States Patent [19]

Koibuchi

[11] Patent Number: 5,135,098
[45] Date of Patent: Aug. 4, 1992

[54] APPARATUS FOR MOUNTING CHIP DEVICE ON PRINTED CIRCUIT BOARD

[75] Inventor: Masaaki Koibuchi, Ibaraki, Japan

[73] Assignee: Ikegami Tsushinki Co., Ltd., Tokyo, Japan

[21] Appl. No.: 718,968

[22] Filed: Jun. 21, 1991

Related U.S. Application Data

[60] Division of Ser. No. 421,406, Oct. 13, 1989, Pat. No. 5,058,721, which is a continuation of Ser. No. 146,010, Jan. 10, 1988, Pat. No. 4,908,092.

[30] Foreign Application Priority Data

Jan. 20, 1987 [JP] Japan ................................. 62-10225
Jun. 6, 1987 [JP] Japan ................................. 62-141914

[51] Int. Cl.[5] ............................................. B65G 47/24
[52] U.S. Cl. ................................................. 198/345.1
[58] Field of Search ...................................... 198/345.1

[56] References Cited

U.S. PATENT DOCUMENTS

| | | | |
|---|---|---|---|
| 3,102,627 | 9/1963 | Acton et al. | 198/345.1 |
| 4,397,385 | 8/1983 | Booth et al. | 198/345.1 |
| 4,741,429 | 5/1988 | Hattori et al. | 198/345.1 X |

Primary Examiner—D. Glenn Dayoan
Attorney, Agent, or Firm—Spencer, Frank & Schneider

[57] ABSTRACT

An apparatus for automatically mounting chip devices provided in tape units onto a printed circuit board at given positions thereof, said printed circuit board being placed on an XY table movably horizontally in X and Y directions, including a plurality of tape unit mounting units, each supplying chip devices one by one in the upside down fashion, a suction chamber arranged along the tape unit mounting units, a number of carriers each secured to an endless chain and having suction holes such that the suction holes of carriers are always communicated with the inside of the suction chamber, so that a chip device held and sucked on a carrier is fed along the suction chamber into a first transporting position, a turnover device for receiving the chip device at the first transporting position, holding the chip device with the aid of the suction force, turning over the chip device and feeding the chip device into a second transporting position, a mounting head having a suction nozzle receiving and holding the chip device with the aid of the suction force at the second transporting position and mounting the chip device on the printed circuit board.

4 Claims, 36 Drawing Sheets

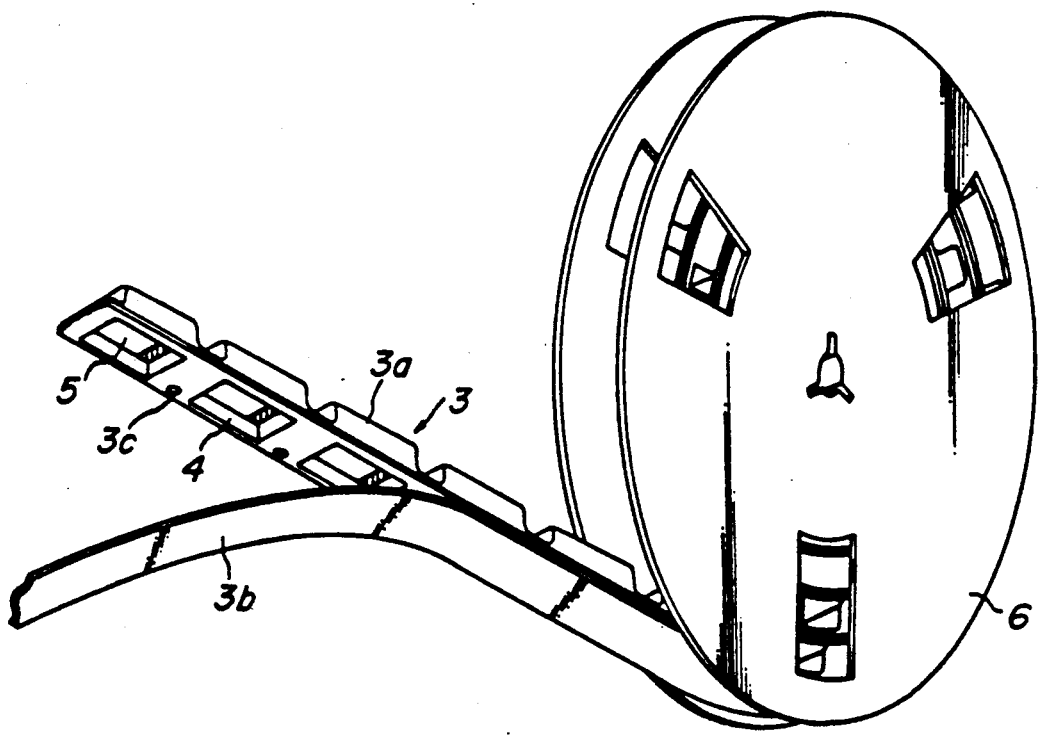
FIG_2

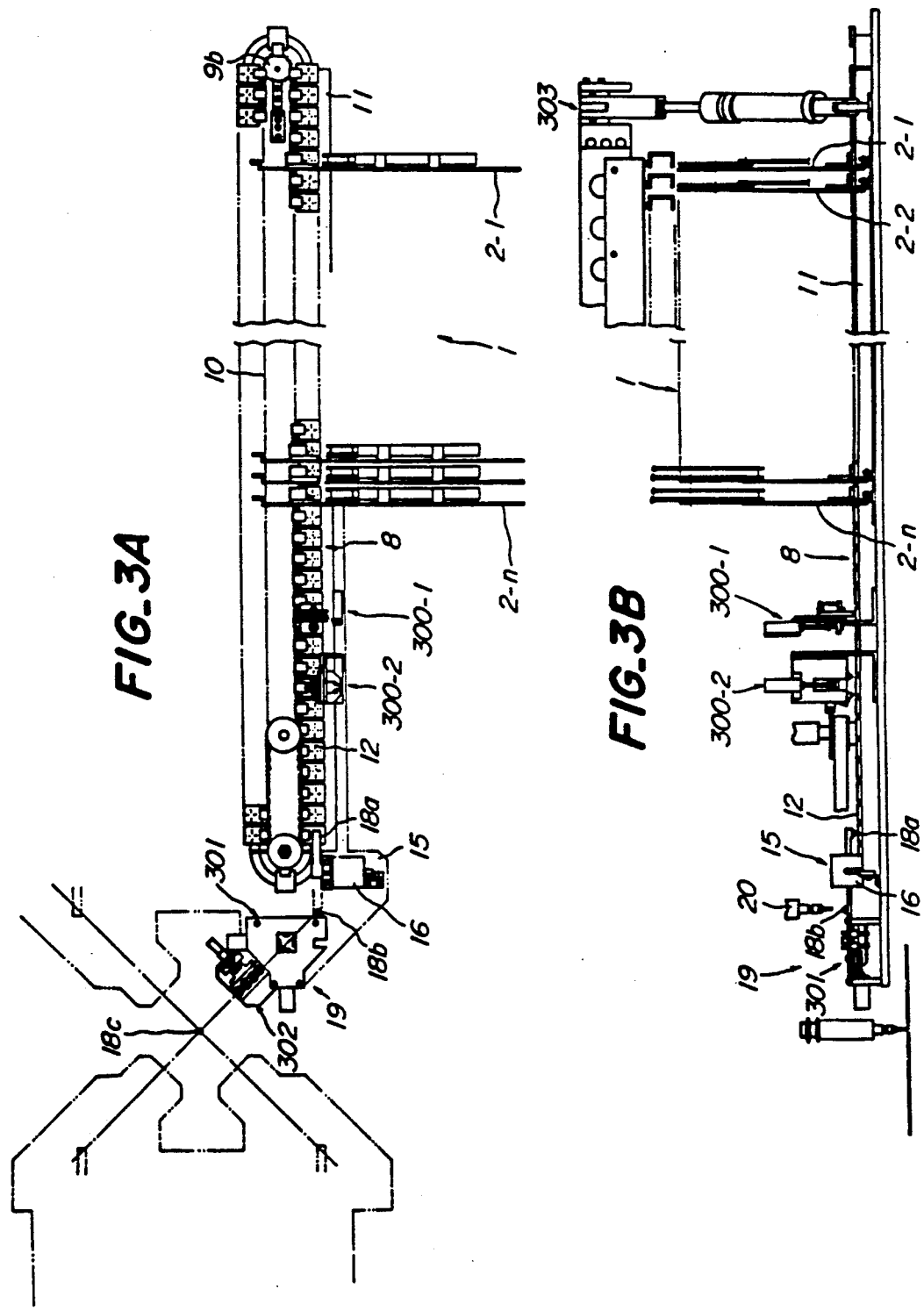

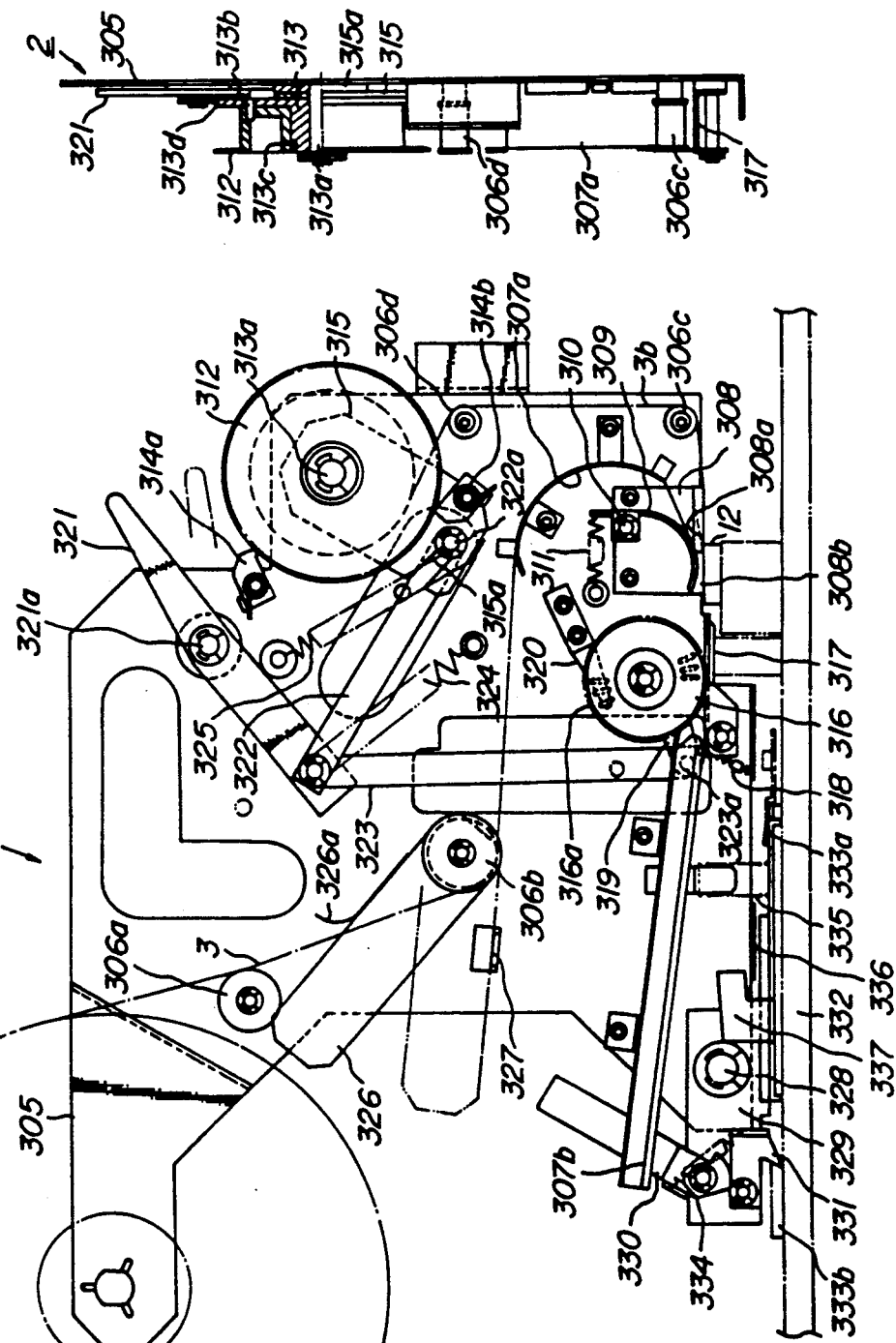

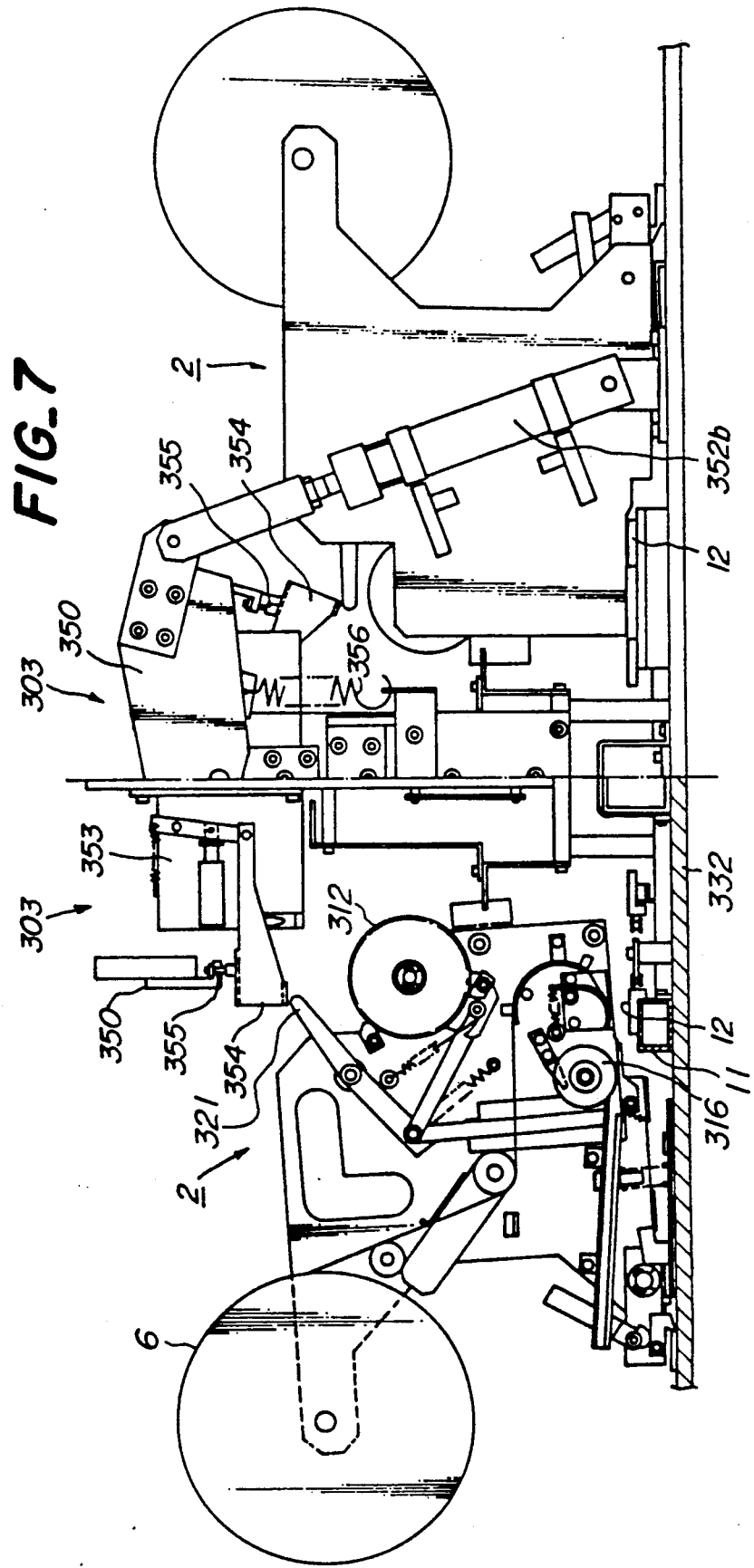

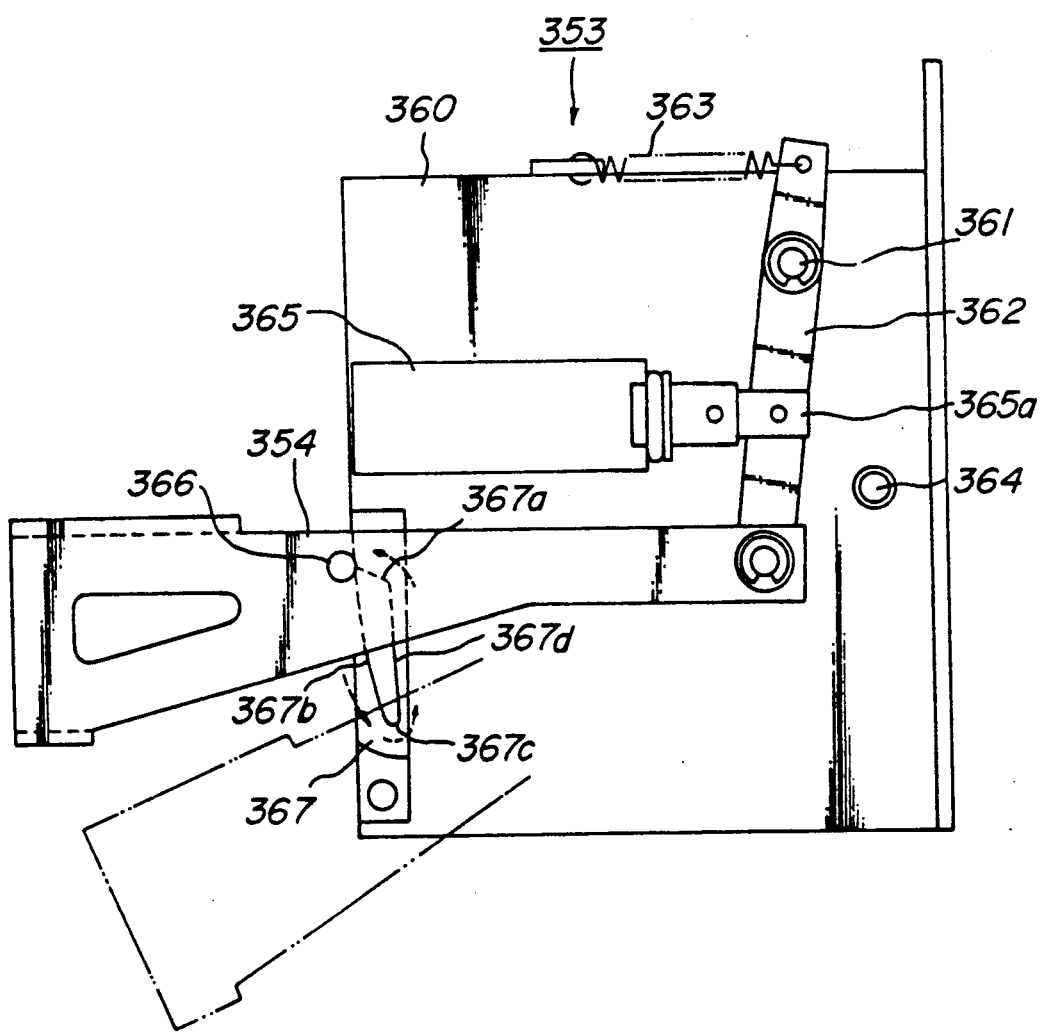
FIG_8

FIG_9A
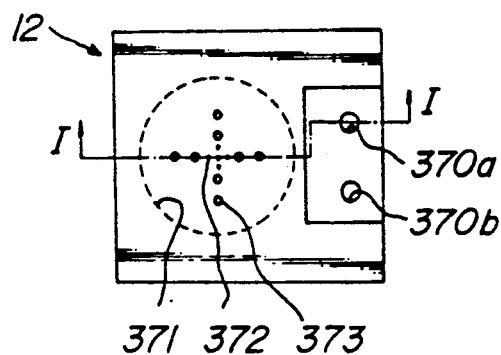
FIG_9B
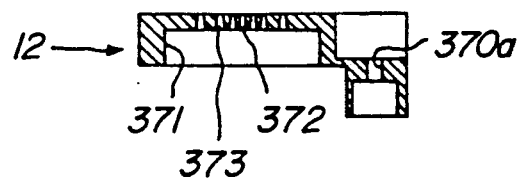

FIG_10A
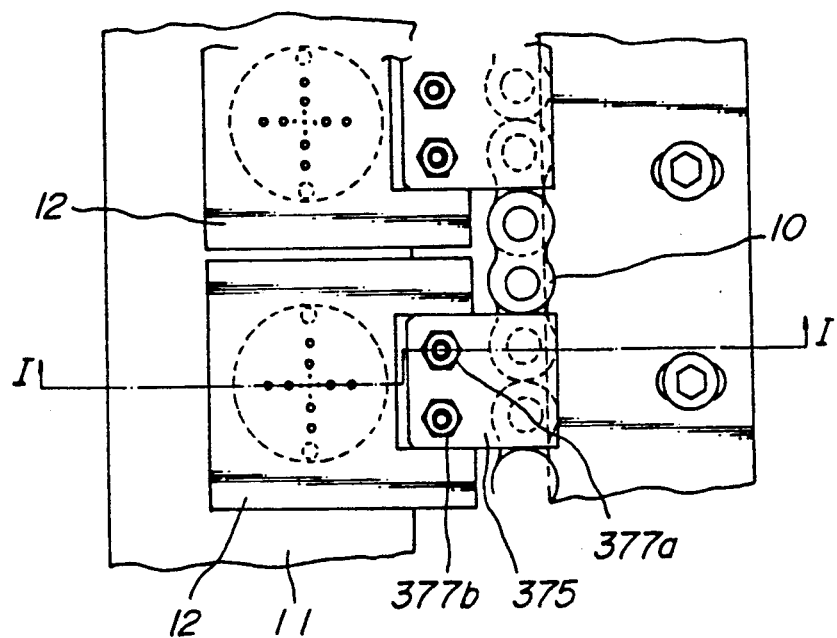
FIG_10B
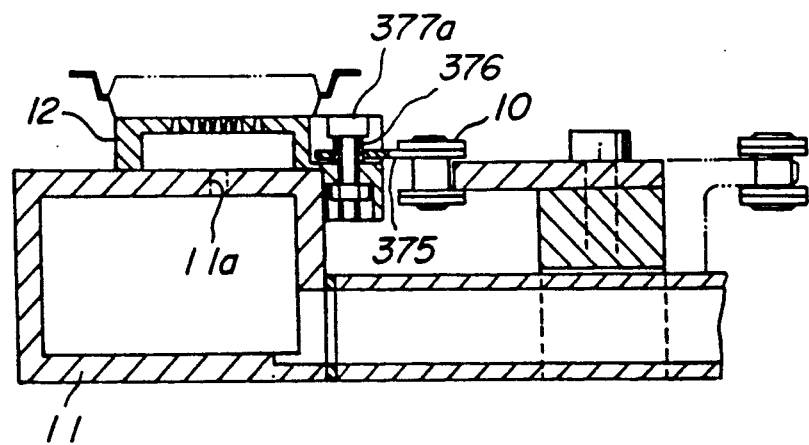

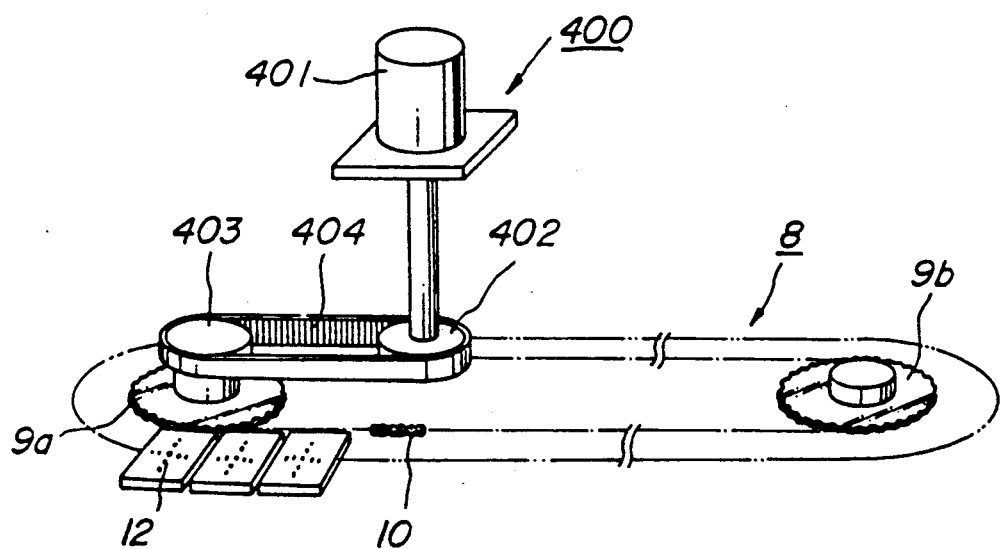
FIG_11

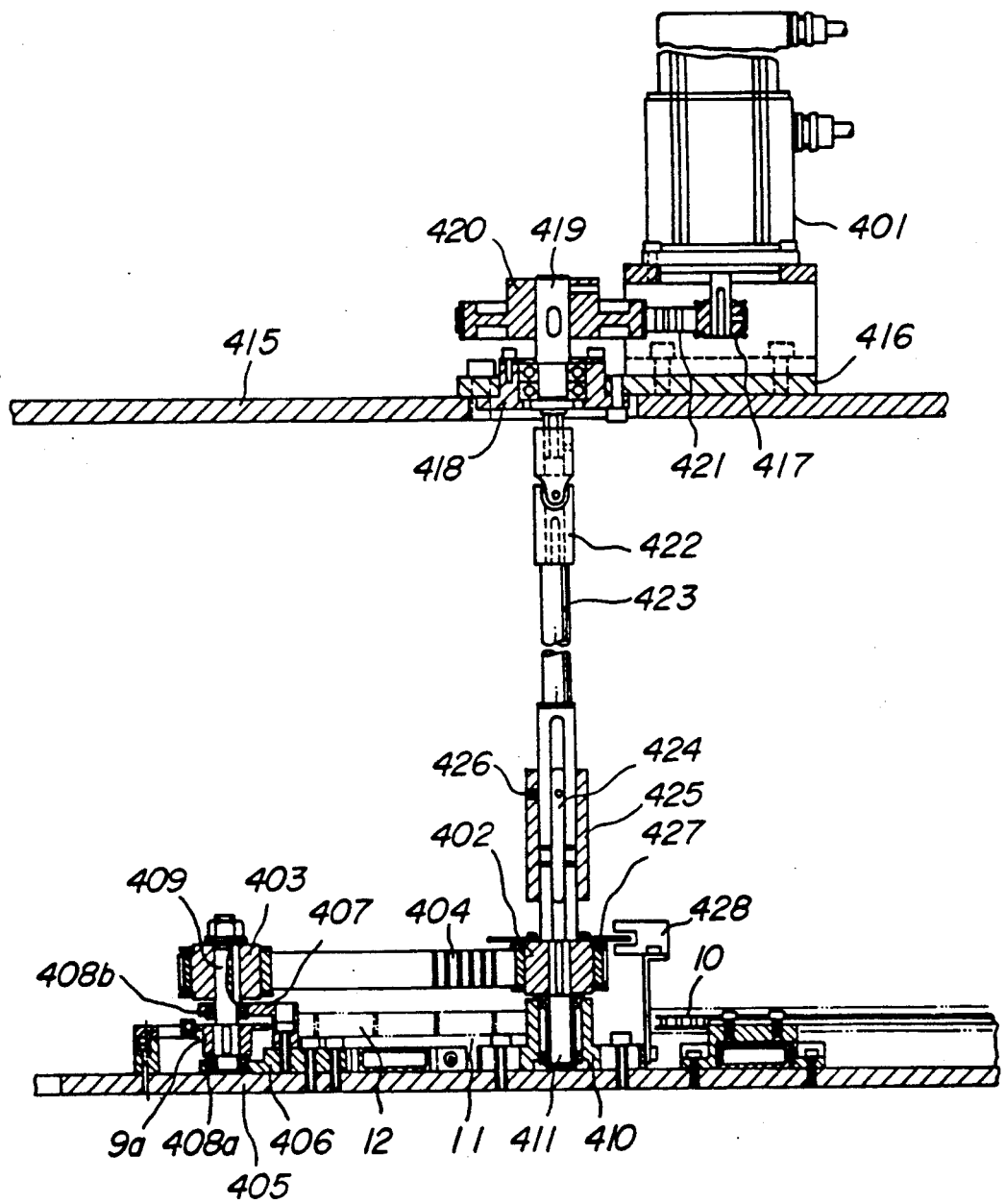
FIG_12

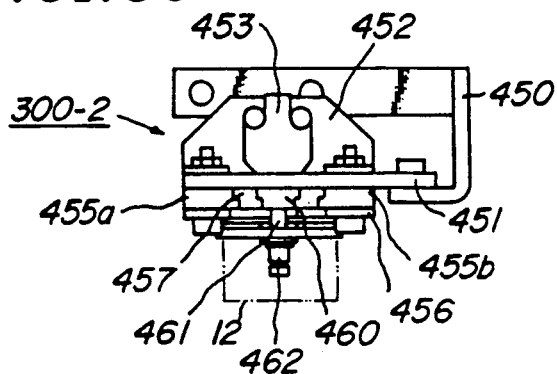
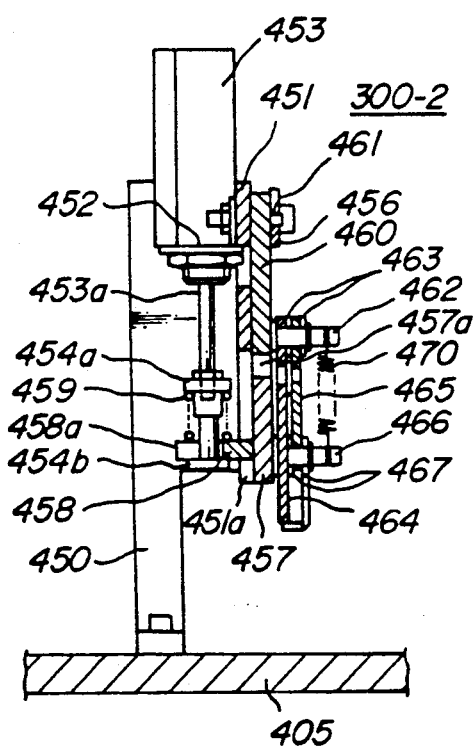
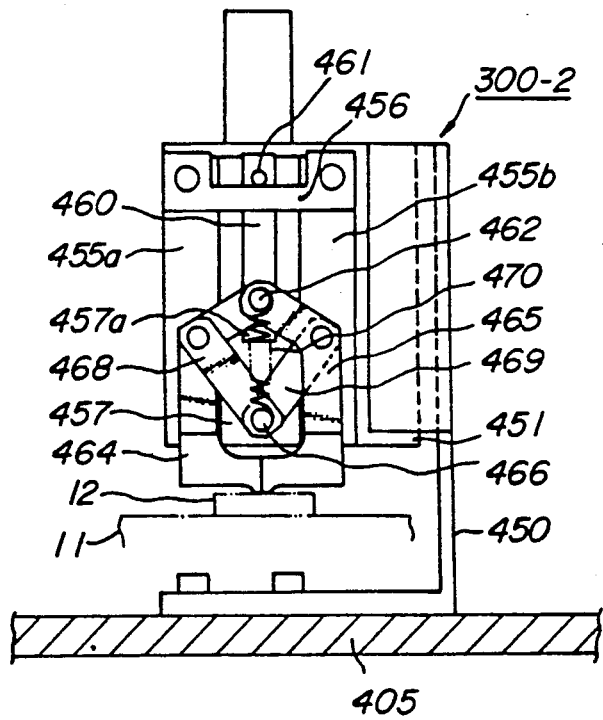

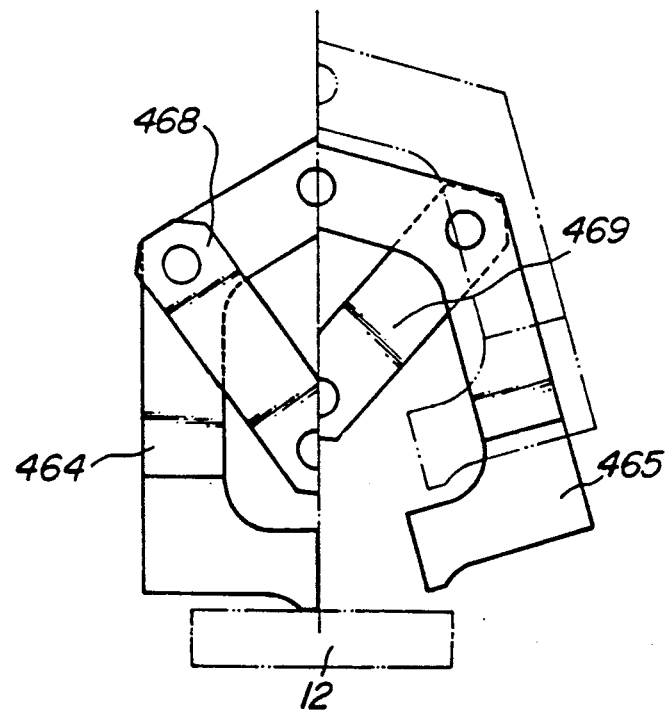
FIG_14

FIG_16A
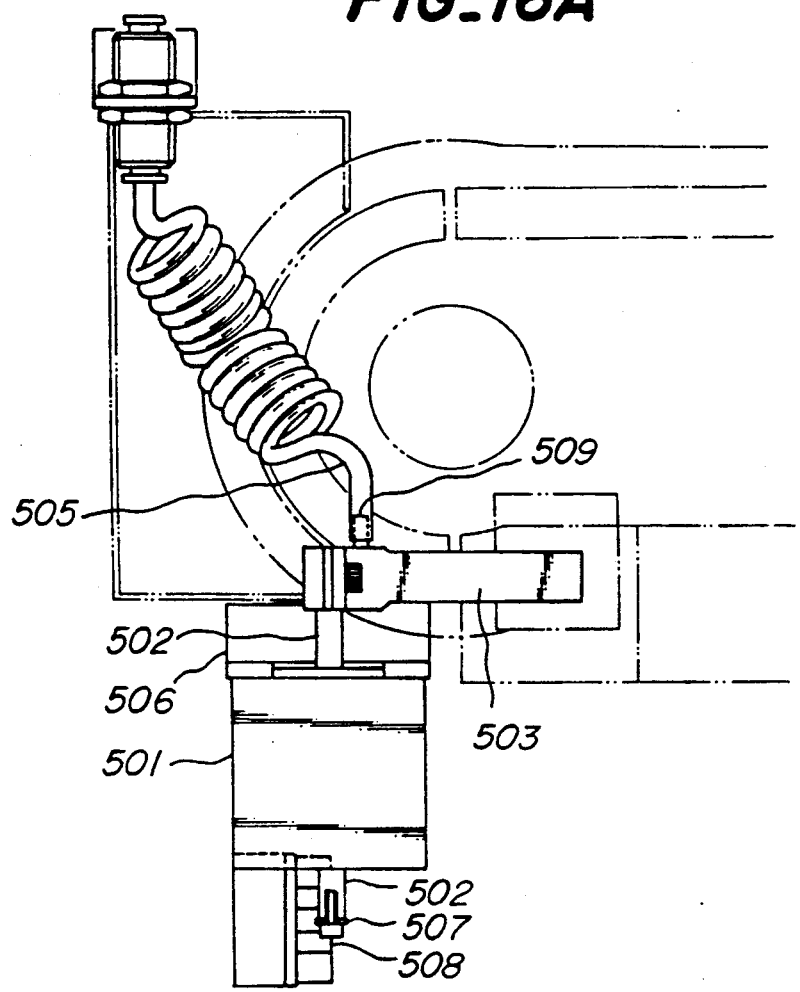
FIG_16B
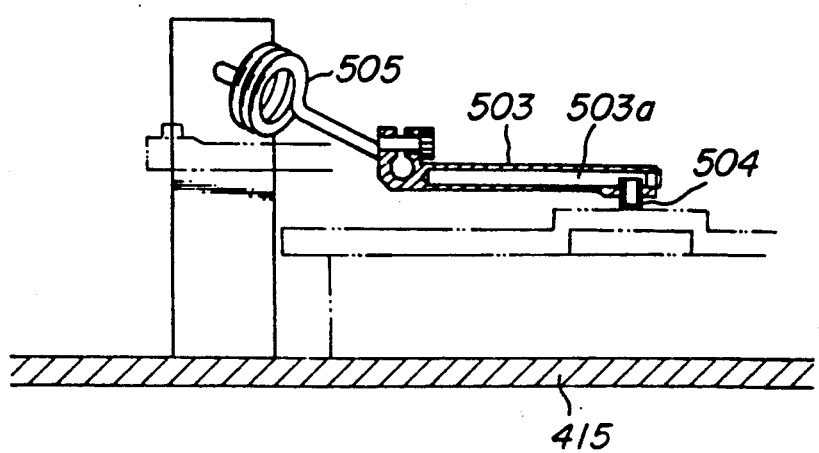

FIG_16C
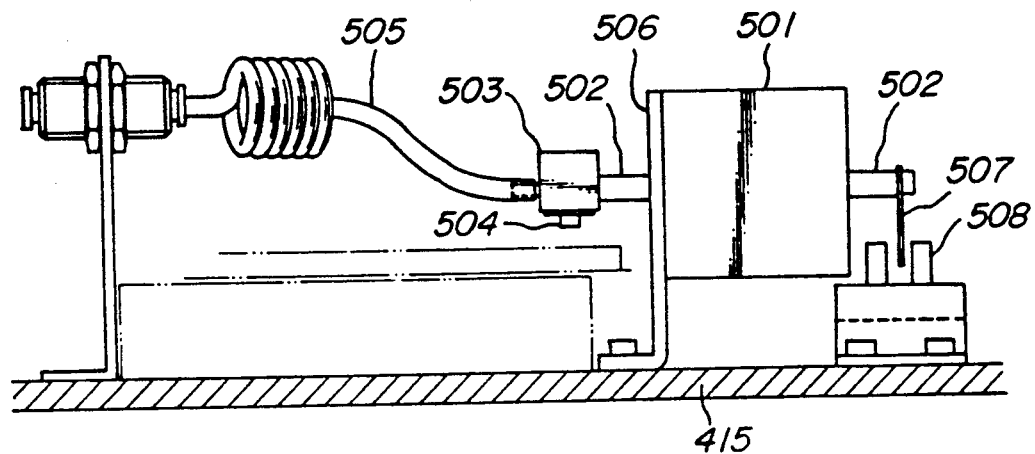
FIG_16D
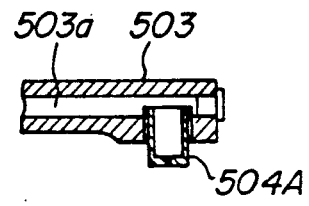
FIG_16E
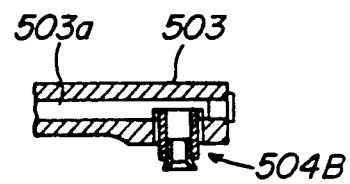

FIG_18A
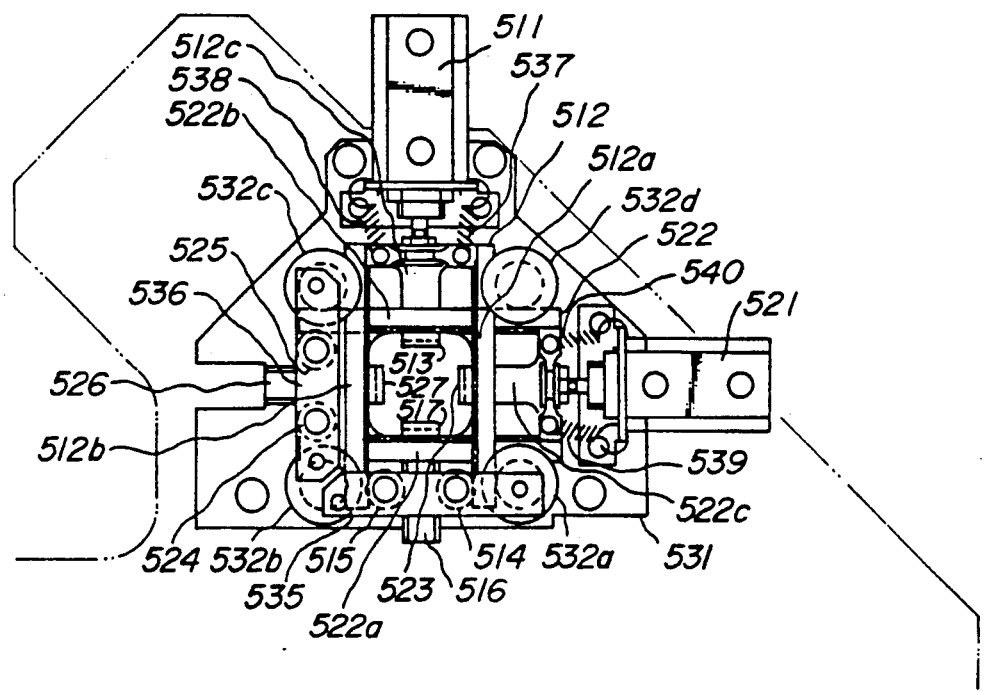
FIG_18B
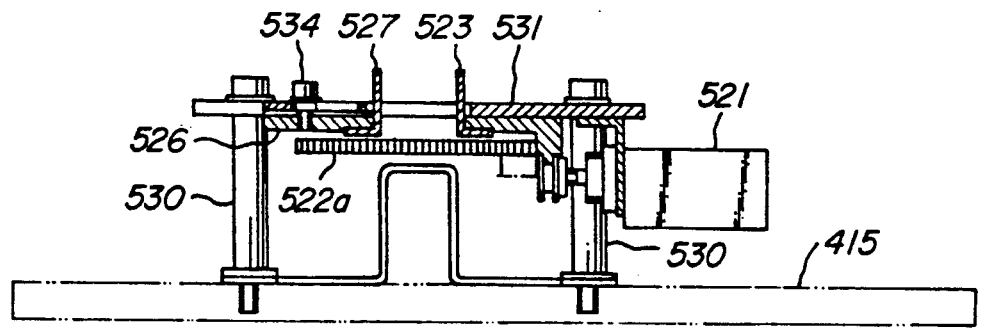

FIG_18C
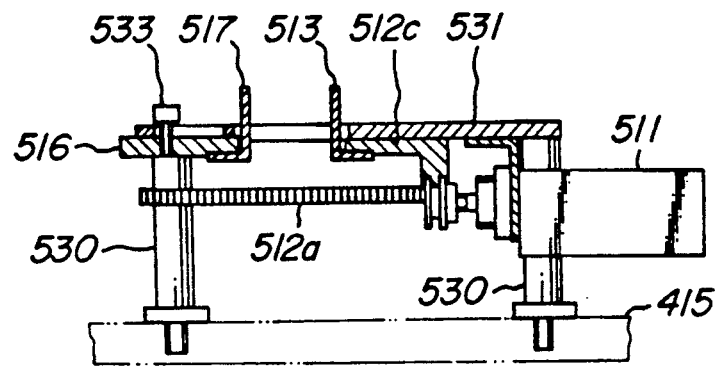
FIG_18D
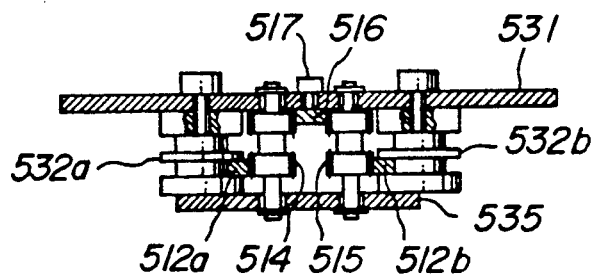
FIG_18E
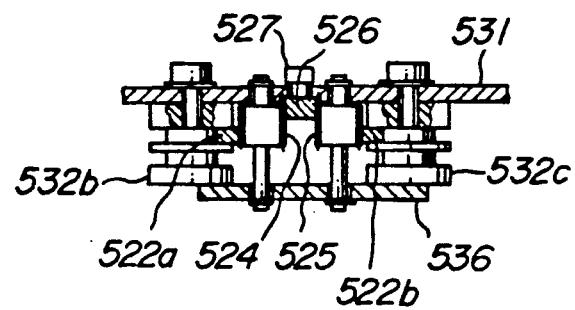

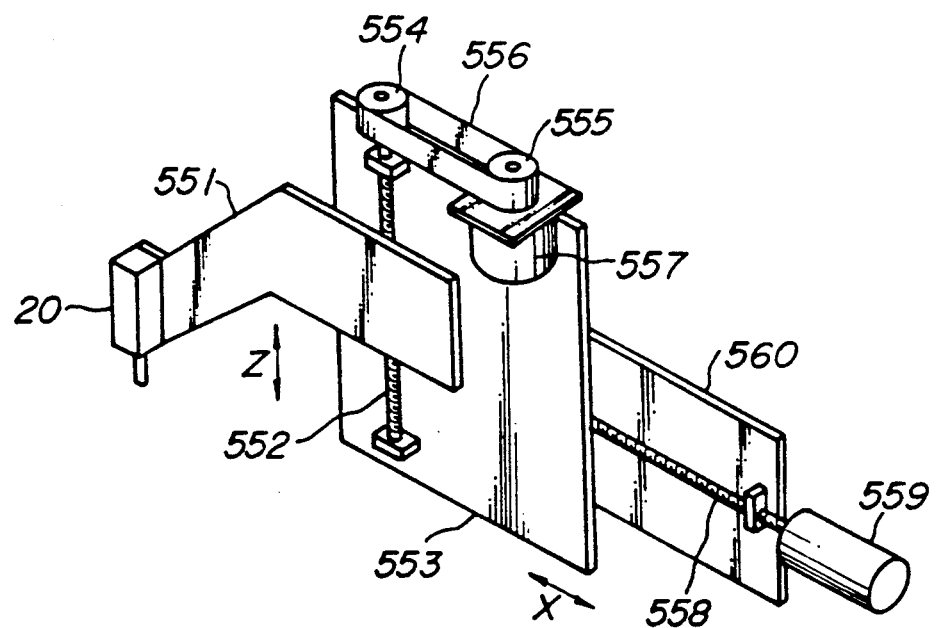
FIG_19

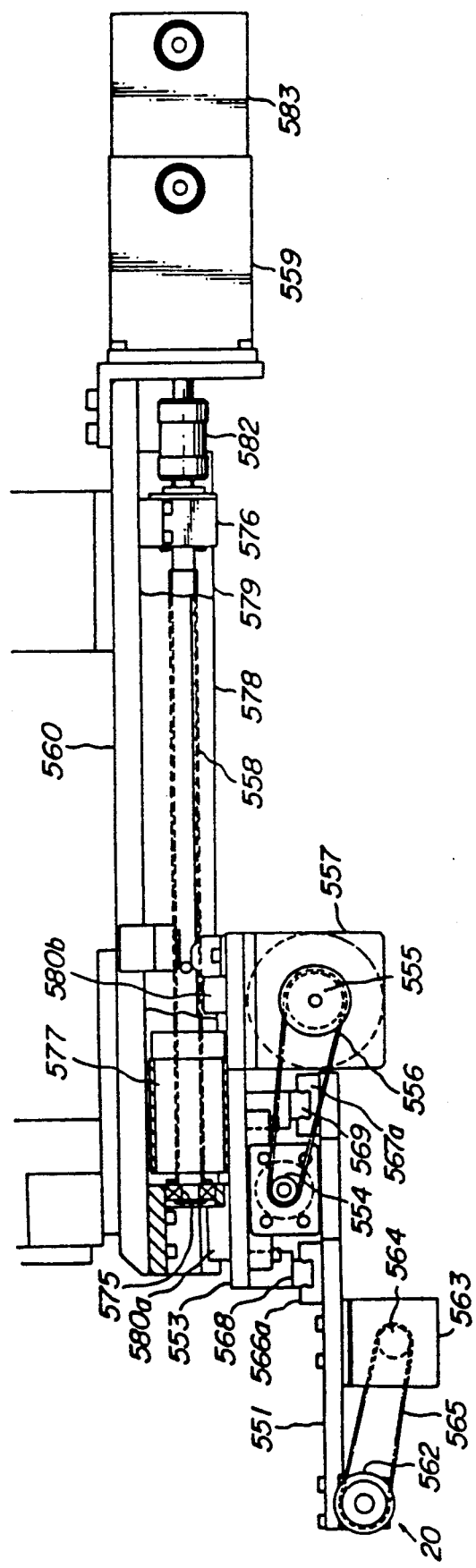
FIG._20A

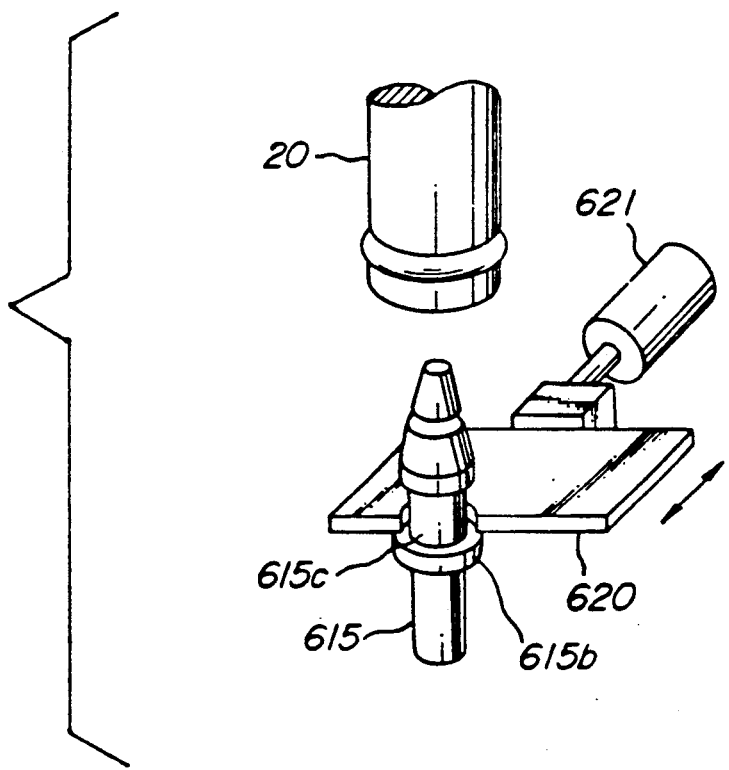
FIG_25

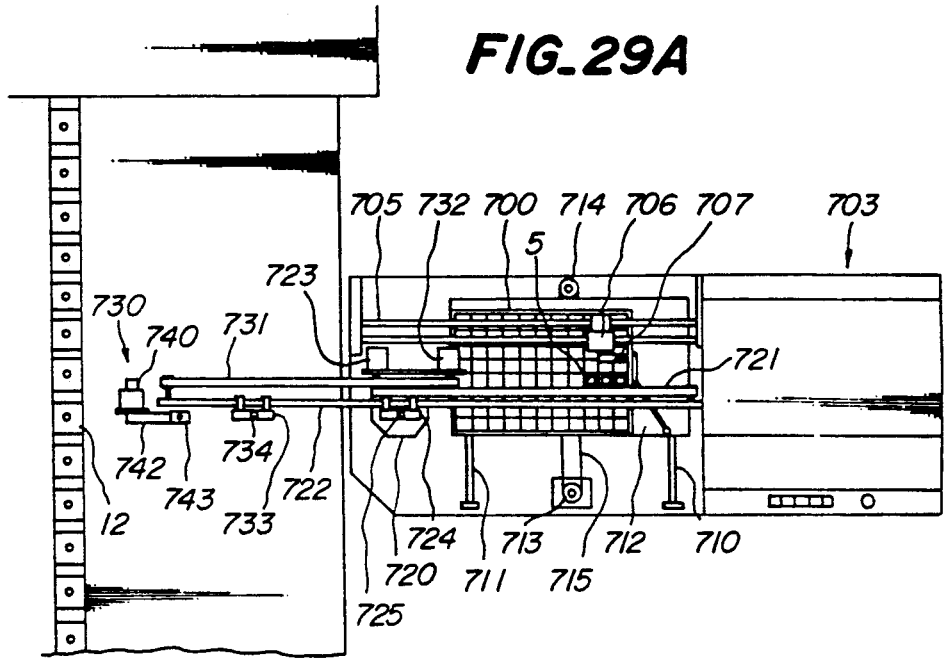
FIG_29A
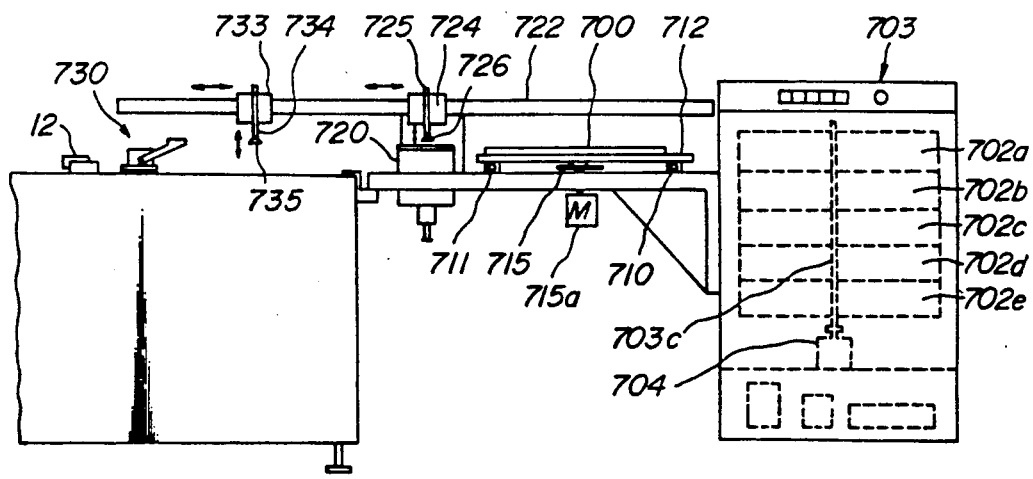
FIG_29B

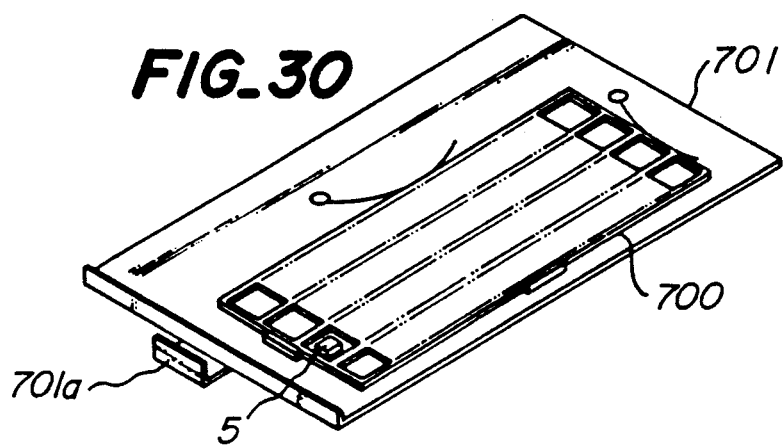
FIG_30
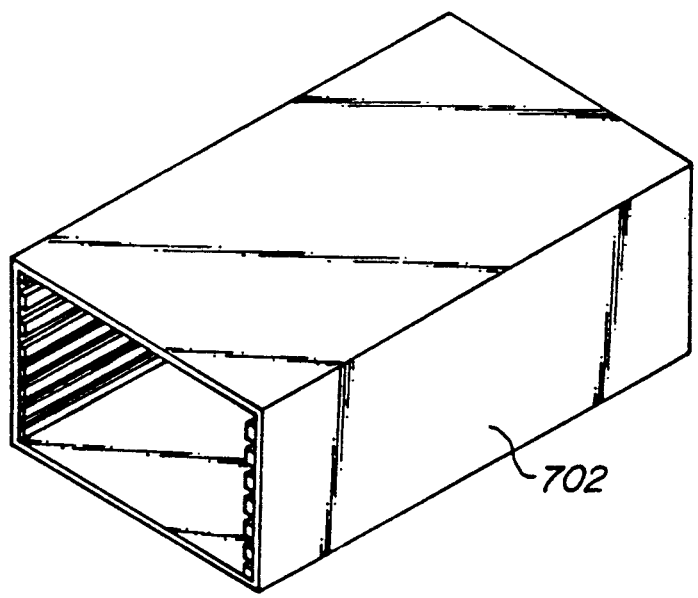
FIG_31

APPARATUS FOR MOUNTING CHIP DEVICE ON PRINTED CIRCUIT BOARD

This is a division of application Ser. No. 07/421,406 filed Oct. 13th, 1989 now U.S. Pat. No. 5,058,725 which is a continuation of Ser. No. 07/146,010 filed Jan. 10th, 1988 now U.S. Pat. No. 4,905,092.

BACKGROUND OF THE INVENTION

Field of the Invention and Related Art Statement

The present invention relates to an apparatus for mounting automatically various kinds of chip devices on a printed circuit board.

Such an apparatus is generally called "Chip Mounter" and has been used for mounting active chip devices such as IC, transistor and diode chips as well as passive chip devices such as resistor capacitor and coil chips.

Various kinds of chip mounters have been developed. Usually a number of chip devices of the same kind are arranged in a tape which is wound as a coil. In a known chip mounter, a plurality of tape coils are set on a plurality of tape units arranged side by side and these tape units are moved with respect to a mounting head. After a tape unit on which a tape coil having desired chip devices has been indexed into the mounting head, one chip device is supplied from the tape unit to the mounting head. Then the mounting head is indexed at a given position on a printed circuit board placed on an XY table and the chip device is mounted on the printed circuit board.

In such an apparatus the chip device to be mounted is held at a lower end of the mounting head with the aid of a suction force, and therefore the number of different kinds of chip devices which can be mounted by the single mounting head can not be made large. Therefore, there has been also proposed a chip mounter in which a plurality of mounting units, each composed of a tape unit, mounting head and XY table, are arranged in series with each other and a printed circuit board is transported through successive mounting units, while desired chip devices are mounted on the circuit board in respective mounting units.

There is further proposed a chip mounter including a plurality of mounting heads each holding chip devices having different sizes and shapes and a desired mounting head is selectively used in accordance with a chip device to be mounted.

In the known chip mounter in which a number of tape units are moved with respect to the single mounting head, it is required to provide a large scale driving mechanism for moving the heavy and long tape unit assembly in a reciprocal manner. It is apparent that such a mechanism could not move the tape unit assembly at a high speed, and thus the mounting rate is limited. Particularly, when it is required to mount many different kinds of chip devices, the width and length of the tape unit assembly become large and the mounting rate would be further decreased. Moreover, the range over which the tape unit assembly is moved is quite long, so that the space factor of the chip mounter is very small.

In the known chip mounter in which a plurality of mounting units are arranged side by side and a printed circuit board is transported through these mounting units, the whole apparatus is liable to be very large and expensive. Further, there is additionally required mechanisms for moving the printed circuit board between successive mounting units. Therefore, the mounting rate is also limited.

In the known chip mounter in which a plurality of mounting heads are selectively used, the apparatus may be made rather small, but the construction of the mounting head assembly becomes quite complicated and the mounting rate low, because the changing of mounting heads requires a relatively long time.

SUMMARY OF THE INVENTION

The present invention has for its object to provide an apparatus for mounting automatically different kinds of chip devices on a printed circuit board at a high speed, while the whole apparatus can be made small in size, simple in construction and low in cost.

According to the invention, an apparatus for mounting automatically chip devices on a printed circuit board comprises supplying means for supplying chip devices one by one in an upside down fashion in a predetermined order;

chip device feeding means for receiving and holding the chip devices supplied from the chip device supplying means with the aid of a suction force, while the chip devices are held in the upside down fashion, transporting position;

turning over means for receiving the chip device indexed at the first transporting position with the aid of the suction force, turning over the chip device thus held and transporting the chip device into a second transporting position; and mounting means for receiving the chip device indexed at the second transporting position with the aid of the suction force, transporting the chip device thus held on printed circuit board at a predetermined position thereof and placing the chip device on the printed circuit board.

BRIEF DESCRIPTION OF THE DRAWINGS

FIG. 2 is a perspective view depicting a tape unit;

FIGS. 3A and 3B are plan and side views, respectively illustrating the chip device supplying and feed units;

FIGS. 4A to 4D show the construction of the tape unit mounting unit;

FIGS. 6 and 7 are front and side views illustrating the detailed construction of the tape unit driving device;

FIG. 8 is a side view showing the one-shot unit;

FIGS. 9A and 9B are plan and cross sectional views representing the carrier;

FIGS. 10A and 10B are plan and cross sectional views, respectively showing the assembly of the carriers and chain;

FIG. 11 is a perspective view illustrating the chain driving unit;

FIG. 12 is a cross sectional view illustrating the detailed construction of the chain driving device;

FIGS. 13A to 13C and 14 show the simple centering unit;

FIGS. 16A to 16E show the detailed construction of the simple centering unit;

FIGS. 18A to 18E illustrate the detailed construction of the centering unit;

FIG. 19 is a perspective view depicting the principal construction of the mounting unit;

FIGS. 20A and 20B are plan and side views, respectively showing the detailed construction of the mounting unit;

FIG. 25 is a perspective view schematically showing the nozzle exchange device;

FIGS. 29A and 29B are plan and front views, respectively illustrating the QFP supply unit;

FIGS. 30 and 31 are perspective views depicting the QFP pallet and stocker, respectively.

DESCRIPTION OF THE PREFERRED EMBODIMENTS

Figure 1:
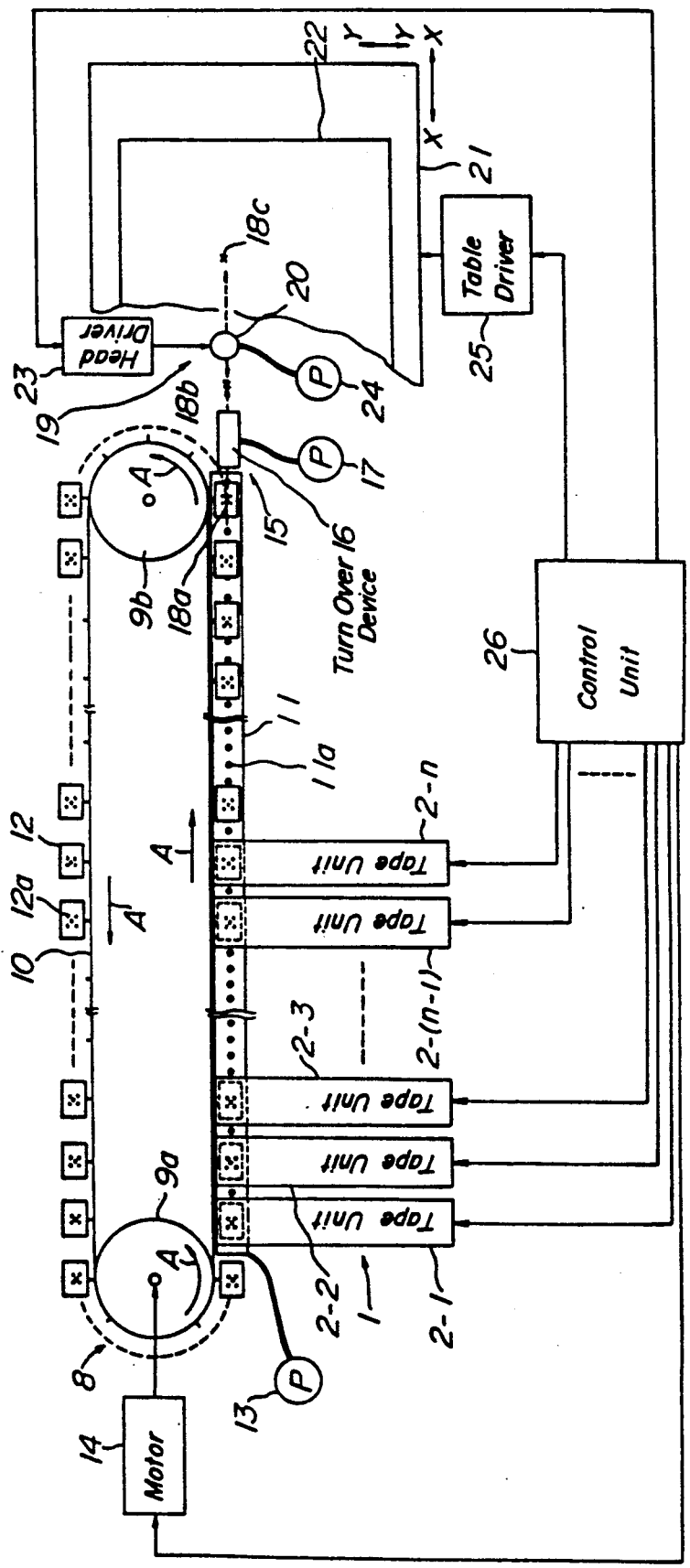
FIG. 1 is a schematic plan view showing the principal construction of an embodiment of the automatic chip mounter according to the invention.

FIG. 1 is a schematic view showing schematically the basic construction of an embodiment of the chip mounter according to the invention. A tape unit mounting unit 1 comprises a plurality of tape units 2-1~2-n arranged side by side in a horizontal direction at a constant pitch. In each tape unit there is arranged a tape containing a number of chip devices.

As illustrated in FIG. 2, a tape 3 comprises a containing tape 3a having a number of depressions 4 formed therein at a constant pitch in the longitudinal direction, and a cover tape 3b which is adhered onto the containing tape 3a in a removable manner. Chip devices 5 of the same kind are provided in respective depressions 4 and the tape 3 is wound on a real 6. In the containing tape 3a there are formed holes 3c along one side thereof at positions between successive depressions 4.

In FIG. 1, different kinds of tapes may be provided in respective tape units 2-1~2-n or a plurality of chip devices of the same kind may be provided in a plurality of tape units, if chip devices of the relevant kind are frequently used.

The tape 3 provided in the tape unit 2 is selectively fed in a stepwise manner, while the cover tape 3b is peeled out of the containing tape 3a. In this manner, chip devices can be fed into a feeding unit 8 one by one.

The feeding unit 8 comprises a pair of sprockets 9a and 9b, endless chain 10 provided around the sprockets, suction chamber 11 arranged along the chain and a number of carriers 12 which are secured to the chain in such a manner that the carriers are caused to slide on the suction chamber. The carriers 12 are arranged at the same pitch as that of the tape units 2-1~2 n. In a top surface of the suction chamber 11 there are formed a number of suction holes 11a along the longitudinal direction thereof. The suction chamber 11 is coupled with a suction pump 13 so that the space inside the chamber is maintained at a negative pressure of, for example, $-100$ mm Hg and air is sucked within the chamber via the holes 11a. It should be noted that the negative pressure within the chamber 11 may be set to a value within a range of $-60 \sim -200$ mm Hg. The suction holes 11a are formed at such a pitch that the carrier 12 can always cover at least one suction hole. In a rear surface of the carrier 12 there is formed a suction buffer which is communicated with suction openings 12a. Therefore, the suction pump 13 sucks the air through suction openings 12a, the suction buffer, suction hole 11a and chamber 11.

The chain 10 is rotated as shown by an arrow A in a stepwise manner by means of a motor 14 coupled with the sprocket 9a such that successive carriers 12 are indexed with respect to successive tape units 2-1 to 2-n. When a chip device 5 is fed on a carrier 12 in the upside down fashion, the chip device is held on the carrier with the aid of the suction force, because the chip device clogs the suction openings 12a.

The chip device held on the carrier 12 is transported into a turn over unit 15 including a turnover device 16 which is coupled with a suction pump 17. At first, the turnover device 16 sucks the chip device held on the carrier 12 positioned at a first transporting position 18a with a suction force which is higher than the suction force by means of which the carrier retains the chip device. This former suction force may be set to a value within a range of $-300 \sim -500$ mm Hg. Therefore, the chip device is transferred from the carrier 12 into the turnover device 16. Then, the turnover device turns over the chip device by 180° about an axis extending horizontally. Therefore, the top surface of the chip device faces upward. Then, the chip device is fed into a second transporting position 18b. At this second transporting position, the chip device is transferred from the turnover device into a mounting unit 19.

The mounting unit 19 comprises a mounting head 20 which holds the chip device at its lower end with the aid of the suction force and places the chip device thus held on a printed circuit board 22 mounted on an XY table 21. The mounting head 20 is moved by a mounting head driving device 23 horizontally between the second transporting position 18b and a mounting position 18c as well as vertically at respective positions 18b and 18c. Further in order to orient the chip device into a desired direction, the mounting head 20 is rotated about a vertical axis. In order to hold the chip device onto a tip of the mounting head 20, the mounting head is coupled with a suction pump 24 which generates a negative pressure of $-300 \sim -500$ mm Hg. In case of transporting the chip device from the turn over unit 15 to the mounting head 20, the suction force of the turn over unit 15 is stopped or decreased, and further after the chip device has been placed on the printed circuit board 22, the suction force of the mounting head is stopped or reduced. In the present embodiment, after a given position of the printed circuit board 22 is indexed into the mounting position 18c by moving the XY table 21 by means of an XY table driving device 25, a syringe containing an adhesive agent is moved downward and a given amount of adhesive agent is applied on a given portion of the printed circuit board by actuating the syringe. Then, the mounting head 20 is moved downward and the chip device held at its tip is placed on the printed circuit board at the position on which the adhesive agent has been applied. In this manner, the chip device can be mounted and fixed on the printed circuit board. The tape units 2-1 to 2-n, chain driving motor 14, suction pumps 17 and 24, head driving device 23 and XY table driving device 25 are controlled by a control unit 26.

Prior to the actual mounting, it is necessary to determine which chip devices are mounted at which positions on the printed circuit board. This may be effected by a profiling mode or by a programming mode. In the profiling mode, at first the mounting head is indexed manually at a given position on the printed circuit board and then the kind of chip device to be mounted at the relevant position is entered by operating a key board. In the present embodiment, the profiling mode is adopted.

FIGS. 3A and 3B are plan and front views, respectively showing the general construction of the chip mounter of the present embodiment. In the present embodiment, there are provided four mounting heads by means of which chip devices are mounted on the printed circuit board at the single common mounting position 18c. Four mounting devices each including respective mounting heads are arranged substantially symmetrically with respect to the common mounting position 18c. The construction of these mounting devices is the same, so that in FIGS. 3A and 3B the construction of a single mounting device is illustrated. The mounting unit comprises tape unit mounting unit 1, feeding unit 8, turning over unit 15 and mounting unit 19. In this embodiment, carriers 12 in each feeding unit 8 ar driven independently from each other by means of separate driving devices, and further in order to transfer a chip device held on a carrier 12 to a turnover device 16 of the turning over unit 15 at a transporting position 18a in a positive manner, there are provided two centering devices 300-1 and 300-2 having a simple construction by means of which the chip device held on the carrier is clamped in the X direction parallel to the feeding direction as well as the Y direction perpendicular to the X direction. In the mounting unit 19 there are arranged centering device 301 and suction nozzle exchanging device 302 between the second transporting position 18b and the mounting position 18c. By means of the centering device 301 the opsition of a chip device sucked at the tip of a suction nozzle secured to the lower end of the mounting head 20 is corrected in the X and Y directions. By means of the nozzle exchanging device 302 a desired suction nozzle is selectively secured to the mounting head 20 in accordance with the shape and size of chip devices to be mounted.

The remaining mounting devices have the same construction as that mentioned above, but a mounting device for mounting special chip devices such as a QFP (Quad Flat Package) which includes a number of lead wires extending substantially horizontally from the side walls does not comprise the mechanical centering devices 300-1 and 300-2, but includes an electrical centering device comprising an image pick-up device and an image signal processing device.

Now the detailed construction of respective units will be explained.

Tape Unit Mounting Unit

The tape unit mounting unit 1 operates to drive seleotively a plurality of tape units 2-1 2-n which are arranged along the moving path of the carriers 12 at a constant pitch by driving a tape unit driving device 303 and a chip device contained in a tape is supplied onto a carrier 12 of the feeding unit 8 in a turn over fashion. That is to say, on the carrier 12 the rear surface of each chip device faces upward.

Tape Unit

FIGS. 4A and 4B are front and side views, respectively illustrating the tape unit 2. To a base 305 is rotatably secured the reel 6 on which the tape 3 is wound. The tape 3 is guided out of the reel 6 via rollers 306a, 306b and guide 307a to a transferring base 308 provided at a lower portion of the base 305 for defining the level of the chip device transferring path in such a manner that the cover tape 3b faces downward. In the transferring base 308 there is formed a recess 308b for supplying a chip device via a slide surface 308a. At the position of slide surface 308a and recess 308b the tape 3 is pressed downward by means of a tape pusher 309. The tape pusher 309 is journaled by a shaft 310 and is biased by a coiled spring 311 such that the tape 3 is urged against the slide surface 308a.

The cover tape 3b of tape 3 is turned at the recess 308b so that a chip device 5 contained in a depression 4 of the containing tape 3a is dropped onto a carrier 12 via the recess 308b, while the cover tape 3b is peeled off the containing tape 3a. In order to supply positively the chip device 5 onto the carrier 12, the slide surface 308a formed in the transferring base 308 is thinned toward the recess 308b.

The cover tape 3b peeled off the tape 3 at the transferring base 308 is wound on a take-up reel 312 via rollers 306c and 306d. The take-up reel 312 is secured to a reel bracket 313 which is arranged rotatably about a shaft 313a secured to the base 305. The reel bracket 313 comprises a spring pin 313b which is engaged with the take-up reel 312, and an O-ring 313c which is in contact with the take-up reel. In the periphery of the reel bracket 313 there is formed a gear 313d which is engaged with a ratchet 314a provided on the base 305 so that the reel bracket 313 can rotate only in the clockwise direction in FIG. 4A, i.e. in a direction for taking up the cover tape 3b. Between the base 305 and the reel bracket 313 there is arranged a feed plate 315 via a flat washer 315a, the feed plate being rotatable about the shaft 313a. On the feed plate 315 there is provided a ratchet 314b which is engaged with the gear 313d of the reel bracket 313. Therefore, the reel bracket 313, i.e. the take-up reel 312 can rotate in the clockwise direction with the aid of the ratchet 314b only when the feed plate 315 is rotated in the clockwise direction in FIG. 4A. In the present embodiment, the feed plate 315 can be selectively rotated by means of the tape unit driving device 303 as will be explained later.

Figure 4C:
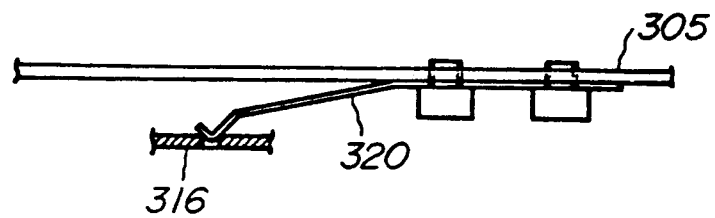
Figure 4D:
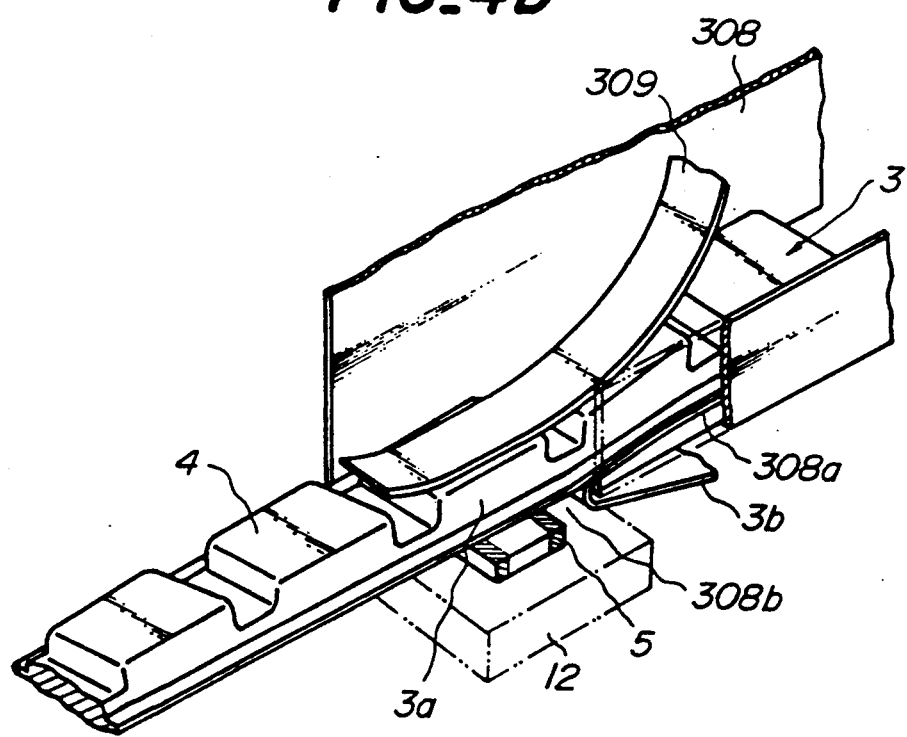

After the chip device 5 provided in the depression 4 of the tape 3 has been supplied onto the carrier 12, the containing tape 3a is fed toward the left in FIG. 4A by means of sprocket 316 and tape guide 307b. The sprocket 316 serves to feed the tape 3 in a stepwise manner. The containing tape 3a is urged against the sprocket 316 by a tape pusher 317 and a gear 316a of the sprocket is inserted into the hole 3c. The tape pusher 317 is biased by a coiled spring 318 to be urged against the containing tape 3a. With the feeding sprocket 316 is coupled a sprocket ring 319 via a one-way clutch and the sprocket ring is selectively rotated by the tape unit driving device 303 as will be explained later. Then the tape 3 is fed by one pitch and the cover tape 3b is peeled off the containing tape 3a at the transferring base 308 and the chip device 5 is supplied onto the carrier 12 as shown in FIG. 4D. As illustrated in FIG. 4C, a positioning stopper 320 provided on the base 305 is urged against the feeding sprocket 316.

In order to rotate the take-up reel 312 and feeding sprocket 316 by means of the tape unit driving device 303, a link 321 is provided on the base 305 rotatable about a shaft 321a. One end of the link 321 is rotated in the clockwise direction in FIG. 4A by means of the tape unit driving device 303. To the other end of the link 321 there are rotatably secured one end of each link 322 and 323, and the other end of the link 322 is engaged with the feed plate 315 by means of pin 322a and flat washer 315a. The other end of the link 323 is engaged with the sprocket ring 319 via a pin 323a. The link 321 is biased by a coiled spring 324 to rotate in the counter clockwise direction in FIG. 4A. The feed plate 315 is biased by a coiled spring 325 to rotate in the clockwise direction in FIG. 4A, the spring 325 being weaker than the spring 324. Therefore, in the normal condition of the link 321 shown by a solid line in FIG. 4A, the take-up reel 312 is biased by the spring 325 to rotate in the clockwise direction, so that the cover tape 3b is subjected to the tension applied to the take-up reel 312.

When the link 321 is rotated in the clockwise direction by means of the tape unit driving device 303, the feed sprocket 316 is rotated in the clockwise direction via the link 323 and sprocket ring 319 and the tape 3 is fed by one pitch. Then after a short delay time due to the difference in the spring force between the springs 324 and 325 has been elapsed, the feed plate 315 is rotated in the clockwise direction via the link 322. Therefore, the reel bracket 313 and take-up reel 312 are rotated in the clockwise direction by means of the ratchet 314b, and the cover tape 3b is wound on the take-up reel 312 by one pitch. Then, the chip device 5 stored in the tape 3 is supplied through the recess 308b of the transferring base 308 on the carrier 12 in the upside down fashion. When the link 321 is returned into the original position, only the sprocket ring 319 is rotated in the counter clockwise direction. Further, since the rotation of the reel bracket 313 in the counter clockwise direction is inhibited by the ratchet 314a, only the feed plate 315 and ratchet 314b are rotated in the counter clockwise direction.

In order to detect that the tape 6 has been wholly rewound from the reel 6, a shutter plate 326 is journaled to the roller 306b and an engaging member 326a is secured to the shutter plate at such a position that the member 326a is engaged with a portion of the tape 3 between the rollers 306a and 306b. When the tape 3 has been wholly supplied from the reel 6, the shutter plate 326 is rotated in the counter clockwise direction due to the force of gravity until it is engaged with a stopper 327 secured to the base 305. When the shutter plate 326 is engaged with the stopper, a detection light path is interrupted by the shutter plate. The detection light path is defined by light emitting element and light receiving element. When the light receiving element detects the interruption of the detection light path, there is generated an alarm.

In order to provide the tape unit 2 on the tape unit mounting unit 1 in a removable manner, a guide base 329 is provided on the base 305 with the aid of a shaft 328 at a lower portion of the base which is opposite to the portion at which the transferring base 308 is provided. To one end of the guide base 329 there are journaled clamp lever 330 and clamp lock 331. The other end of the guide base 329 is engaged with a guide 333a secured to a base 332 of the tape unit mounting unit 1. By rotating the clamp lever 330 in the clockwise direction to engage the clamp lock 331 with an engaging plate 333b secured to the base 332, the tape unit 2 may be detachably secured to the tape unit mounting unit 1. Between the clamp lever 330 and clamp lock 331 is arranged a coiled spring 334, so that when the clamp lever 330 is rotated in the counter clockwise direction, the clamp lock 331 is rotated in the counter clockwise direction due to the force of the spring 334 and is disengaged from the engaging plate 333b. Between the guide base 329 and the base 305 is arranged a coiled spring 335 for biasing the base 305 to rotate in the counter clockwise direction about a shaft 328. Therefore, when the tape unit driving device 303 is in the non-operating condition, the recess 308b of the transferring base 308 is sufficiently spaced from the carrier traveling path so that the carriers 12 can be moved smoothly. The rotation of the base 305 is limited by the engagement of an engaging member 336 secured to the base 305 with a stopper 337 secured to the guide base 329. In the manner explained above, before supplying the chip device 5 onto the carrier 12, the base 305 is rotated in the clockwise direction against the force of the spring 335 in conjunction with the rotation of the link 321 due to the operation of the tape unit driving device 303 and the recess 308b of the transferring base 308 is moved closer to the carrier 12. Then the link 321 is further rotated to supply the chip device 5 onto the carrier 12.

Tape Unit Driving Device

Figure 5:
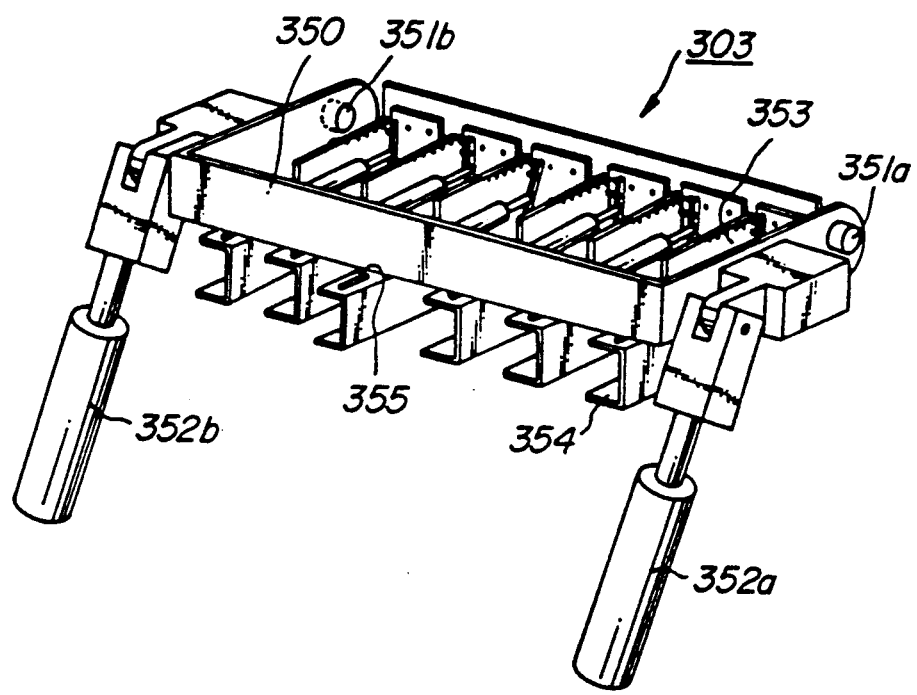
FIG. 5 is a perspective view of the tape unit driving unit.

FIG. 5 is a perspective view showing a principal construction of the tape unit driving device 303. The tape unit driving device 303 comprises a pushing plate 350 which extends in the direction in which the tape units 2 are arranged side by side. The pushing plate 350 is rotatably supported by shafts 351a and 351b at both ends and is rotated by air cylinders 352a and 352b. A plurality of one-shot units 353 are provided in accordance with respective tape units 2 arranged in the tape unit mounting unit 1. The one shot unit 353 comprises a selection arm 354 which is slidably engaged with the lower end of the pushing plate 350 by means of a pin 355. If the selection arm 354 remains in a rest position, even when the pushing plate 350 is rotated downward, the selection arm is not brought into contact with the link 321. On the other hand, when the selection arm 354 is extended by operating the one-shot unit 353, the pushing plate 350 is urged against the link 321 of a corresponding tape unit 2 to rotate the link in the clockwise direction.

Figure 6:
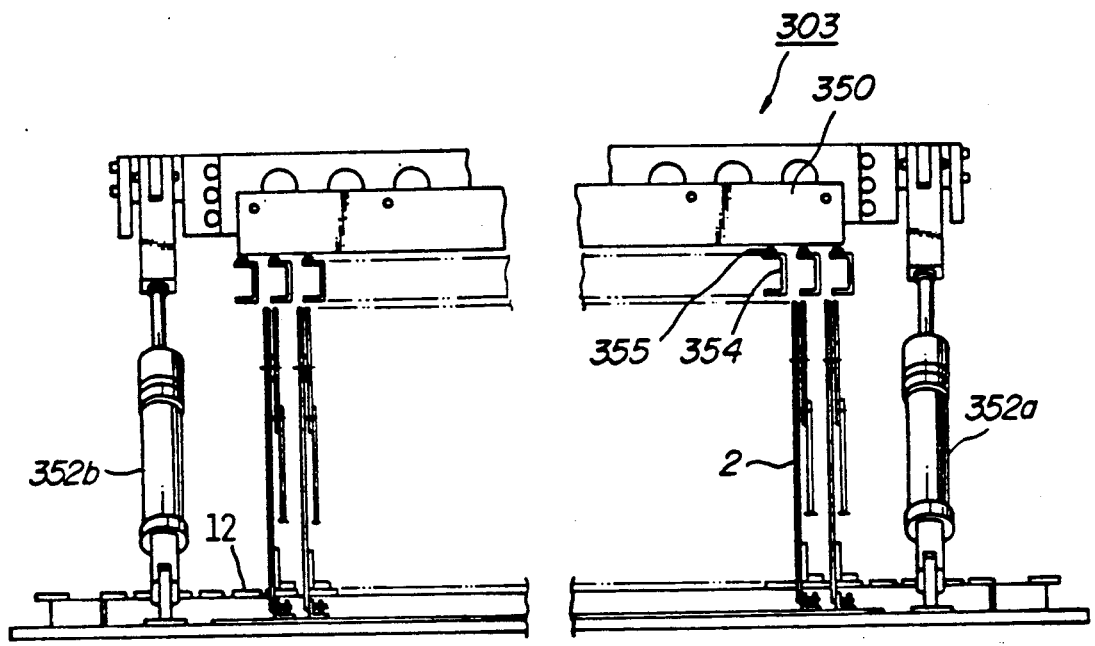

FIGS. 6 and 7 are front and side views illustrating the tape unit driving unit 303. In FIG. 7, the left-hand driving device is shown as a cross sectional view. The pushing plate 350 is biased by a coiled spring 356 to rotate downward and the selection arms 354 for respective one-shot units 353 are slidably hung from the pushing plate via the pins 355. In FIG. 7, the pushing plate 350 in the left-hand driving device 303 is in a normal position, while the pushing plate in the right-hand driving device is in the descendant position.

One-shot Unit

FIG. 8 is a side view of the one-shot unit 353. The one-shot unit 353 comprises a base 360 and a lever 362 journaled to a shaft 361 secured to the base 360. One end of the selection arm 354 is journaled to one end of the lever 362. To the one end of the lever 362 is connected a coiled spring 363 to bias the lever to rotate in the counter clockwise direction in FIG. 8. This rotational movement is limited by a stopper 364. A solenoid 365 is secured to the base 360 and a plunger 365a of solenoid is coupled with the lever 362 at a position between the fitting positions to the shaft 361 and selection arm 354, respectively. When the solenoid 365 is energized, the lever 362 is rotated in the counter clockwise direction against the force of the spring 363 so that the link 321 s rotated via the engagement of the selection arm with the link. The selection arm 354 is hung from the pushing plate 350 by means of the pin 355. That is to say, one end of the pin 355 is secured to the lower edge of the pushing plate 350 and the other end of the pin is inserted into an elongated hole formed in an upper surface of the selection arm 354.

A guide pin 366 is secured to the selection arm 354 and is engaged with a dog 367 formed in the base 360. When the solenoid 365 is energized, and the selection arm 354 is moved into the selecting position, the selection arm is retained in this position. Further, with the pushing plate 350 is moved downward, the guide pin 366 is moved along the dog 367.

When the solenoid 365 is energized, the lever 362, is rotated in the counter clockwise direction against the coiled spring 363, so that the selection arm 354 is moved into the selecting position. In this selecting position, the guide pin 366 has passed over a mountain portion 367a of the dog 367 and has been engaged with an upright portion 367b. In this position, the selection arm 354 is retained in the selecting position even when the solenoid 365 is deenergized. When the selection arm 354 is downwardly rotated in conjunction with the rotation of the pushing plate 350, the guide pin 366 is moved downward along the upright portion 367b of dog 367. By means of this rotational movement of the selection arm 354 a chip device is supplied from a tape 3 onto a carrier 12. Near the stop position of the downward movement of the pushing plate 350, the selection arm 354 is disengaged from the link 321 due to the action of the spring 363 and the guide pin 366 passes through a valley portion 367c of the dog 367. Thereafter, the guide pin 366 is moved upward along an upright portion 367d opposite to the upright portion 367b in accordance with the upward movement of the pushing plate 350 and is returned into a home position. Therefore, in the selection mode, the guide pin 366 turns around the dog 367 by one revolution. It should be noted that when a tape unit is not selected, the lever 362 is in such a position that it is urged against the stopper 364. In this condition, the guide pin 366 is moved along the upright portion 367d and the selection arm 354 is not brought into contact with the link 321 of the relevant tape unit.

As explained above, in the one-shot unit 353 of this embodiment, the selection arm 354 can be retained in the selecting position by energizing the solenoid 36 for a short time, and thus the power consumption can be saved.

Feeding Unit

The feeding unit 8 comprises an endless chain 10, a number of carriers 12 secured to the chain and a suction chamber 11. While the carriers 12 are fed on the suction chamber 11, one or more chip devices 5 are supplied on one or more carriers 12 from the tape unit mounting unit 1 and the chip device thus supplied is fed through the transporting position 18a to the turnover device 16.

As explained above, in three feeding units except for that for feeding chip devices such as QFP there are provided the simple centering devices 300-1 and 300-2 for centering the chip devices in the X and Y directions, respectively.

Carrier

In this embodiment, the carriers 12 of each mounting units have substantially the same construction.

FIG. 9A is a plan view showing the carrier 12 and FIG. 9B is a cross sectional view cut along a line I—I in FIG. 9A. The carrier 12 is formed by a mold of electrically conductive resin. In a side of the carrier 12 there are formed holes 370a and 370b for securing the carrier to the chain 10. In a rear surface of the carrier there is formed a buffer 371 which maintains the negative pressure within the suction chamber 11. In an upper surface of the carrier 12 there are formed five small holes 372 at a central area thereof and eight large holes 373 in a symmetrical manner. The small hole 372 has a diameter of 0.3 mm at the upper surface and of 0.6 mm at the lower surface, and the large hole 373 has a diameter of 0.5 mm at the upper surface and of 1.0 mm at the lower surface. That is to say, these holes 372 and 373 have a tapered configuration.

Since the carrier 12 is made of a conductive resin, undesired electrostatic charge can be effectively prevented. Further, the carrier 12 can be manufactured in an easy and less expensive manner by the mold. Moreover, since the small and large holes 372 and 373 have the tapered configuration, it is possible to suck not only small chip devices, but also large chip devices in a positive manner.

As illustrated in FIGS. 10A and 10B, the carrier 12 is secured to the chain 10 by means of fitting member 375, collars 376 and bolts 377a and 377b.

The suction chamber 11 has a cross section of 12 mm×12 mm, and in an upper surface there are formed suction holes 11a having a diameter of 1.0 mm at a constant pitch. It should be noted that the pitches of the suction holes 11a and carriers 12 and a length of the buffer 371 formed in the rear surface of the carrier are so determined that at least one suction hole is always communicated with the buffers of the carriers so that the air is always sucked through the suction holes 372 and 373 formed in the carrier 12. The chamber 11 is coupled with the suction pump 13 (see FIG. 1) so that the pressure within the buffer 371 is maintained at a given negative pressure within −60 to −200 mm Hg.

Carrier Driving Unit

FIG. 11 is a perspective view showing a principal construction of the carrier driving unit. In this embodiment, the endless chain 10 extended between the sprockets 9a and 9b is moved by an independent driving unit 400. The driving unit 400 comprises a servomotor 401 for rotating a pulley 402 which is coupled via a timing belt 404 with a pulley 403 coaxially secured to the sprocket 9a. In this manner, the chain 10 can be rotated by the motor 401 by means of the pulley 402, timing belt 404, pulley 403 and sprocket 9a.

In the manner explained above, since the chains 10 in each driving unit 8 are driven by respective driving units 400 independently from each other, it is not necessary to provide electromagnetic clutches and thus the whole unit can be manufactured at a lower cost. Further, the length of the chain 10 may be simply lengthened to increase the number of tape units which can be set in the tape unit mounting unit 1.

FIG. 12 is a cross sectional view illustrating a detailed construction of the carrier driving unit. The sprocket 9a is secured to a shaft 409 which is rotatably supported by chain blocks 406 and 407 by means of bearings 408a and 408b. The pulley 403 is secured to the shaft 409. To a base 405 is journaled a shaft 411 via a bearing 410, and the pulley 402 is fixed to the shaft 411. The pulleys 402 and 403 are coupled with each other by means of the timing belt 404.

To a stationary plate 415 arranged horizontally is secured to the servomotor 401 via a motor base 416 and a pulley 417 is secured to an output shaft of the motor 401. To the stationary plate 415 is journaled a shaft 419 via a bearing 418, and a pulley 420 is secured to the shaft 419. Between the pulleys 417 and 420 there is arranged a timing belt 421. The shaft 419 is connected by means of a joint 422 to a connecting rod 423 which is coupled with the shaft 411 by means of a slide key 424. A connecting portion of the rod 423 and shaft 411 by means of the slide key 424 is covered with a coupling 425 which is fixed to the rod 423 by means of a screw 426.

In order to move the chain 10 precisely in the stepwise manner, a shutter 427 is secured to the pulley 402 and the rotation of the shutter is detected by a photosensor 428 to produce a control signal for driving the servomotor 401. In the present embodiment, when the pulley 402 rotates by a quarter turn, the carrier 12 is moved by one pitch.

Simple Centering Unit

FIGS. 13A, 13B and 13C illustrate the construction of the simple centering unit 300-2 for effecting the centering in the X direction. FIGS. 13A, 13B and 13C are front, cross sectional and plan views, respectively. To the base 405 is secured a fitting member 450 to which a centering base 451 is directly secured. On a rear surface of the base 451 is arranged a pin cylinder 453 via a fitting 452, and a pair of flanges 454a and 454b are provided on a plunger 453a of the pin cylinder 453. On the surface of the centering base 451 are provided a pair of slider guides 455a and 455b, while these guides are connected to each other by means of a pushing plate 456. There is further provided a first slider 457 which is slidable between the slider guides 455a and 455b. To the first slider 457 is secured a horizontal plate 458 via a recess 451a formed in the centering base 451, said recess being extended vertically and being opened downward. A recess 458a formed in a tip of the horizontal plate 458 is engaged with the plunger 453a of pin cylinder 453 at a position between the flanges 454a and 454b. Between the upper flange 454a and the horizontal plate 458 is inserted a coiled spring 459.

In the first slider 457 is formed a recess 457a extending vertically and being opened upward, and a second slider 460 is slidably inserted in the recess. At the upper end of the second slider 460 is secured a stopper pin 461 which is made in contact with the pushing plate 456 to limit the downward movement of the second slider. At the lower end of the second slider 460 a pin 462 is secured to which a pair of claws 464 and 465 made of electrically conductive resin are journaled by means of collars 463.

At the lower end of the first slider 457 is secured a pin 466 to which one end of a pair of links 468 and 469 are journaled via collars 467. The other ends of the links 468 and 469 are journaled to the claws 464 and 465 respectively. Between the pins 466 and 462 secured to the first and second sliders 457 and 460, respectively, there is arranged a coiled spring 470 to bias these pins to move close to each other.

FIGS. 13A to 13C illustrate the condition in which the pin cylinder 453 has been energized so that tips of the claws 464 and 465 are brought into contact with each other.

Now the operation of the simple centering unit 300-2 will be explained also with reference to FIG. 14. For the sake of explanation, in FIG. 14 the claw 464 is illustrated to be fixed in such a position that it is brought into contact with the other claw 465. In the non-operating condition of the pin cylinder 453, the first and second sliders 457 and 460 are in the upper portion, and due to the action of the spring 470 the lower end of the first slider 457 is urged against the lower end of the second slider 460. In this condition, the pins 462 and 466 are close to each other and the claws 464 and 465 are in the position shown by a chain line in FIG. 14 and their tips are separated from each other.

When the pin cylinder 453 is actuated to cause the plunger 453a to descend, the first and second sliders 457 and 460 are moved downward together with each other until the stopper pin 461 on the second slider 460 is brought into contact with the pushing plate 456. Then, only the first slider 457 is moved further downward against the force of the coiled spring 470. Therefore, the pin 466 is moved away from the pin 462, and thus the claws 464 and 465 are rotated in opposite directions. Therefore, the chip device on the carrier 12 is clamped by the tips of claws 464 and 465 so that the chip device is moved into a correct position in the X direction. It should be noted that the downward movement of the plunger 453a after the chip device has been clamped by the claws can be absorbed by the deformation of the spring 459.

It should be noted that the simple centering unit 300-1 has the similar construction as that of the above mentioned simple centering unit 300-2 except for the point that the centering direction differs from that of the centering unit 300-2 by 90 degrees. Therefore, the detailed explanation of the simple centering unit 300-1 is dispensed with.

Turnover Unit

Figure 15:
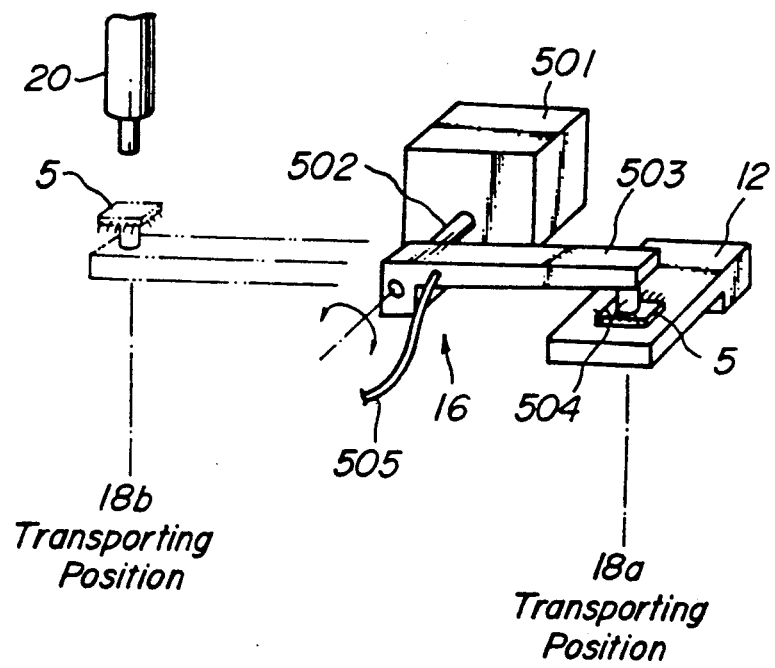
FIG. 15 is a perspective view depicting schematically the detailed construction of the simple centering unit.

FIG. 15 is a perspective view showing the turnover device 16 for turning over the chip device and transferring the chip device into the mounting head 20. The turnover device 16 comprises a pulse motor 501 and an arm 503 having one end coupled with an output shaft 502 of the motor. At the other end of the arm 503 is secured a suction nozzle 504. The nozzle 504 is connected to a vacuum source via a duct formed in the arm and a tube 505. After the chip device 5 held on the carrier 12 has been indexed into the first transporting position 18a, the pulse motor 501 is energized to rotate the arm 503 in the clockwise direction until the nozzle 504 is brought into contact with the chip device, and then the chip device is sucked and held to the suction nozzle 504. Next the pulse motor 501 is driven in the reverse direction to rotate the arm in the counter clockwise direction by 180° into the second transporting position 18b. Therefore, the chip device is turned over and its upper surface faces upward. Then the mounting head 20 is moved downward and the chip device is transferred onto the lower end of the mounting head.

As explained above, in the present embodiment the arm 503 is not moved linearly, but is rotated by 180°, the construction of the turnover device becomes very simple and the price of the device may be decreased materially. Further, a very high operation speed can be utilized.

FIGS. 16A to 16E are plan, cross sectional, side and cross sectional views, respectively showing the detailed construction of the turnover device. The pulse motor 501 is secured to the base 415 via a bracket 506. To the other end of the output shaft 502 of the pulse motor 501 is secured a member 507 which is optically detected by a photosensor 508 secured to the base 515. The photosensor 508 detects the origin of the arm 503 and the position of the arm is controlled in accordance with an output signal from the photosensor. The duct 503a is formed within the arm 503 and one end of the duct is communicated with the suction nozzle 504. The other end of the duct 503a is communicated with a nip 509 to which one end of a tube 505 is connected. In order to allow the arm 503 to rotate freely, there is formed a winding section in the tube 505. A suction nozzle 504A shown in FIG. 16D has a flat end surface in which a small hole is formed and is advantageously used for sucking relatively small chip devices. A suction nozzle 504B illustrated in FIG. 16E comprises a ring and a tapered member having a large hole and is preferably used for sucking relatively large chip devices such as QFP.

Centering Unit

Figure 17:
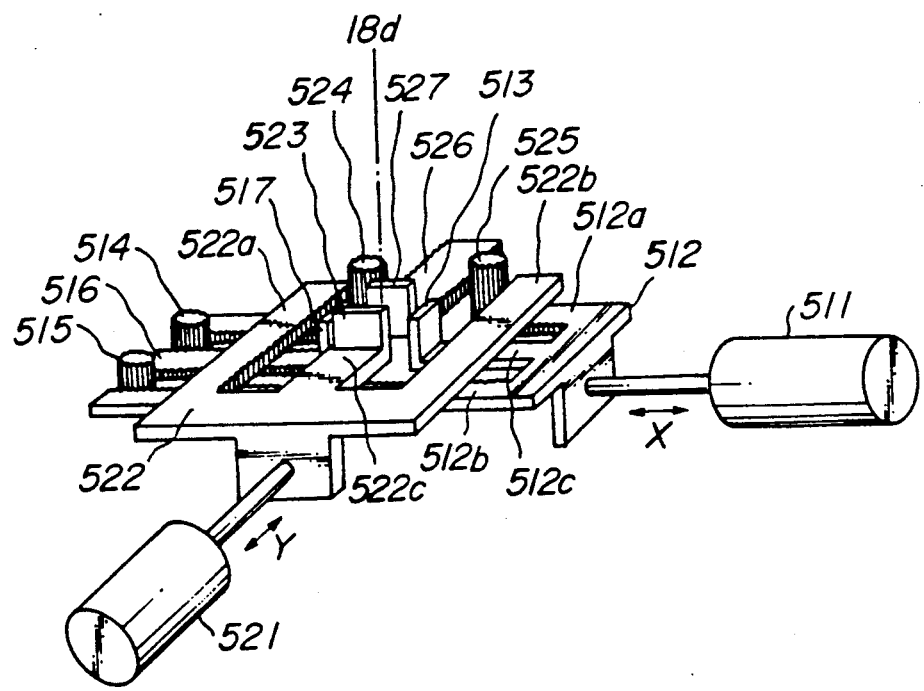
FIG. 17 is a perspective view showing schematically the centering unit.

FIG. 17 is a perspective view showing the construction of the centering unit. After the chip device 5 has been sucked onto the lower end of the mounting head 20 at the second transporting position 18b, the mounting head is moved slightly upward, and then is moved horizontally into the mounting position 18c. During the horizontal movement the mounting head 20 is temporarily stopped at a centering position 18d and is moved downward into the centering unit. The centering unit serves to adjust or correct the position of the chip device held at the lower end of the mounting head in the X and Y directions successively. In order to effect the centering in the X direction, there is provided a cylinder 511 for sliding a plate 512 in the X direction. The plate 512 has formed therein three leg portions 512a, 512b and 512c. In inner edges of outer leg portions 512a and 512b are formed racks. An upright portion 513 is formed at a free end of the central leg portion 512c. A pair of pinion gears 514 and 515 are provided and are engaged with the racks of the leg portions 512a and 512b, respectively. Between the pinion gears 514 and 515 is arranged a plate 516 slidable in the X direction and racks formed on both side edges engage the pinion gears. At one end of the plate 516 is formed an upright portion 517. When the air cylinder 511 is energized, the plates 512 and 516 are moved in opposite directions along the X direction, so that the upright portions 513 and 517 are moved closer to each other or away from each other.

The centering unit in the Y direction is the same as the above mentioned centering unit in the X direction and comprises air cylinder 521, plate 522 having three leg portions 522a–522c, a pair of pinion gears 524, 525 engaged with racks formed in inner side edges of the leg portions 522a and 522b, upright portion formed at an end of the central leg portion 522c, plate 526 having racks engaged with the pinion gears and upright portion 527 formed at an end of the plate 526. When the air cylinder 521 is energized, the plates 522 and 526 are moved in opposite directions along the Y direction and thus the upright portions 523 and 527 are moved close to each other or away from each other.

The mounting head 20 is moved downward to such a level the chip device held at the tip of the mounting head with the aid of the suction force is positioned within a space surrounded by the upright portions 513, 517, 523 and 527. At first, the air cylinder 511 is energized to move the upright portions close to each other until they are urged against the side edges of the chip device opposing each other in the X direction. Then the air cylinder 511 is deenergized to move the upright portions 513 and 517 away from each other. Next the air cylinder 521 is energized to move the upright portions 523 and 527 close to each other until they are brought into contact with the side edges of the chip device opposing each other in the Y direction. After that the air cylinder 521 is deenergized to move the upright portions 523 and 527 away from each other. In this manner, the centering can be effected in the X and Y directions, while the chip device is held positively on the tip of the mounting head with the aid of the suction force.

FIGS. 18A to 18E show the detailed construction of the centering unit. FIGS. 18A, 18B, 18C and 18D, 18E are bottom, front, side and cross sectional views, respectively. As depicted in FIGS. 18B and 18C, an upper plate 531 is secured to the base 415 via posts 530. To the upper plate 531 are arranged rotatably four guide rollers 532a to 532d. Each of the guide rollers comprises two guide recesses each of which supports slidably each of the plates 512 and 522. The plates 516 and 526 are secured slidably to a rear surface of the upper plate 531 by means of pins 533 and 534 which are movable within elongated recesses formed in the upper plate. The pinion gears 514, 515 and 524, 525 are arranged rotatably between the upper plate 531 and elongated plates 535 and 536, respectively. As illustrated in FIG. 18D, each of the pinion gears 514 and 515 comprises two gear portions separated vertically from each other. The lower gear portions of pinion gears 514 and 515 are engaged with the racks formed in the inner side edges of the leg portions 512a and 512b of the plate 512, and the upper gear portions are engaged with the racks formed in the side edges of the plate 516. Between the plate 512 and the air cylinder 511 are arranged coiled springs 537 and 538, and between the plate 512 and the air cylinder 521 are provided coiled springs 539 and 540. By means of these coils, the upright portions 513, 517 and 523, 527 can be returned into the home positions quickly after effecting the centering.

As explained above, the chip device sucked at the tip of the mounting head 20 can be brought in position at a high speed. Further, the construction of the centering unit can be made very compact. It should be noted that the centering unit is used to position chip devices having small dimensions, and large chip devices having large dimensions such as QFP are positioned by the electric centering unit including the image signal processing circuit.

Mounting Unit

FIG. 19 is a perspective view showing the basic construction of the mounting unit. In the present embodiment, the mounting head 20 is moved in two dimensions, i.e., in the X and Z directions, by means of ball screws. The mounting head 20 is secured to an arm 551 which is coupled with a ball screw 552 via a ball nut, said ball screw being extended in the Z direction. The ball screw 552 is supported by a slide plate 553 which is arranged slidably in the X direction. At a top end of the ball screw 552 is arranged a pulley 554, and a timing belt 556 is provided between the pulley 554 and another pulley 555 which is coupled with an output shaft of a pulse motor 557. The slide plate 553 is coupled with a ball screw 558 extending in the X direction by means of a ball nut. One end of the ball screw 558 is connected to a servomotor 559. The slide plate 553 is slidably supported by a guide plate 560.

When the servomotor 559 is energized to rotate the ball screw 558, the slide plate 553 is moved in the X direction and thus the mounting head 20 is also moved in the X direction via the arm 551. When the pulse motor 557 is energized to rotate the ball screw 552, the arm 551 is moved in the Z direction and therefore the mounting head 20 is moved vertically.

In the present embodiment, since the mechanism for moving the mounting head in the Z direction is mounted on the mechanism for driving the mounting head in the X direction, the movements in the X and Z directions can be carried out simultaneously, so that the high speed operation can be attained. Further, the positions of the mounting head in the X and Z directions can be set at will by controlling the motors 559 and 557, and therefore various functions can be easily added or altered and various timings can be simply set. Moreover, the mounting unit can be made constructed simply and inexpensively, and noise generated by the mounting unit can be decreased to a great extent.

Figure 20B:
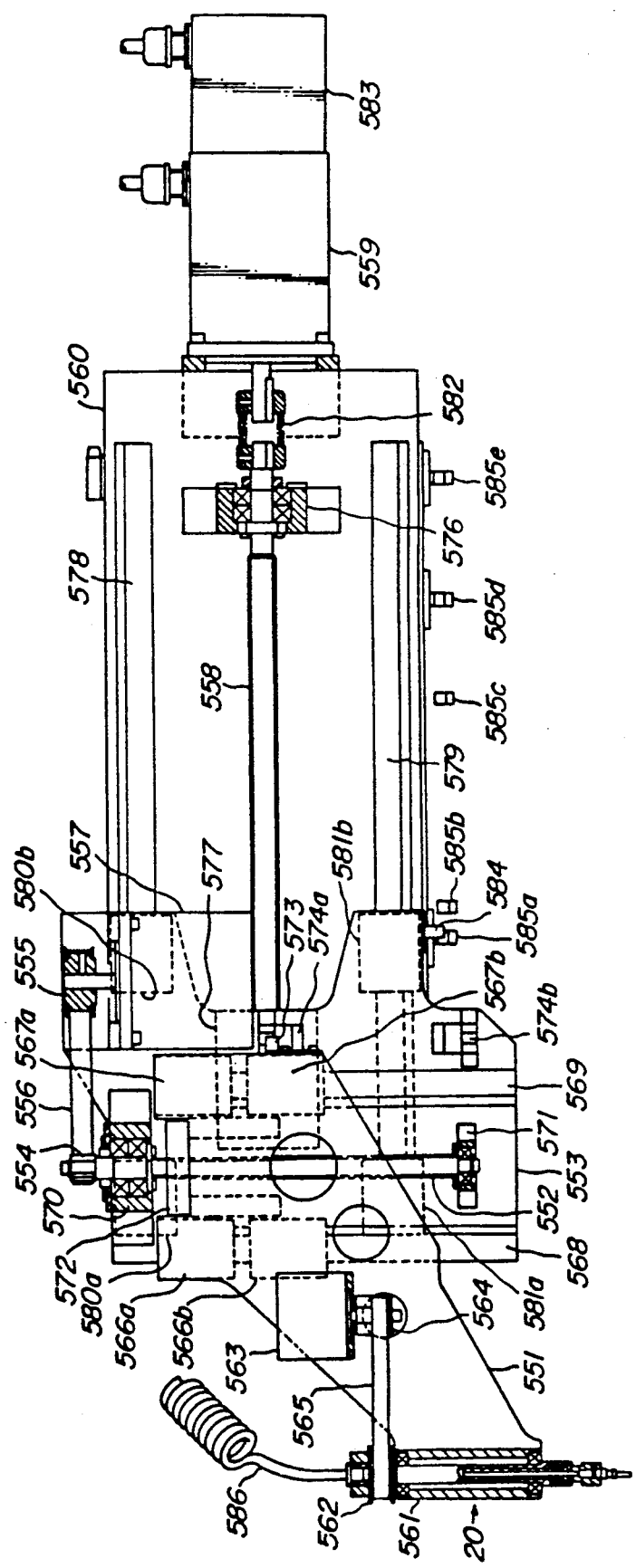

FIGS. 20A and 20B are plan and front views, respectively illustrating the detailed construction of the mounting unit. The mounting head 20 is secured to one side edge of the arm 551. In order to rotate the mounting head 20, a box 561 is secured to the arm 551 and the mounting head 20 is rotatably inserted in the box 561. At an upper end of the mounting head 20 there is provided a pulley 562, and a timing belt 565 is arranged between the pulley 562 and a pulley 564 secured to an output shaft of a pulse motor 563 which is fixed to the arm 551. On the surface of the arm 551 there are arranged four guides 566a, 566b, 567a and 567b extending in the Z direction. In the guides 566a, 566b and 567a, 567b there are clamped rails 568 and 569, respectively which are secured to the slide plate 553 so as to constitute a so-called linear way mechanism. The ball screw 552 is rotatably secured to the slide plate 553 by means of bearings 570 and 571. A ball nut 572 engaged with the ball screw 552 is secured to the arm 551. Therefore, when the pulse motor 557 is energized to rotate the ball screw 552, the arm 551 is moved in the Z direction via the ball nut 572. In order to detect the uppermost and lowermost positions of the arm 551, a shutter 573 is secured to the arm 551 and photosensors 574a and 574b are secured to the slide plate 553.

The ball screw 558 is rotatably supported by bearings 575 and 576 secured to the guide plate 560. The ball screw 558 is engaged with a ball nut 558 secured to the slide plate 553. To the guide plate 560 are fixed a pair of guide rails 578 and 579 which are engaged with sliders 580a, 580b and 581a, 581b, respectively secured to the slide plate 553. The ball screw 558 is coupled with the output shaft of the servomotor 559 via a coupling 582. To the servomotor 559 is connected a rotary encoder 583 for detecting an amount of rotation of the ball screw 558. In order to detect the position of the slide plate 553, i.e. mounting head 20 in the X direction, a shutter 584 is secured to the slide plate, and photosensors 585a to 585e are arranged on the guide plate 560 at positions corresponding to the mounting position decelerating position, nozzle exchange position, centering position and chip device transferring position. The output signal from the photosensor 585b for detecting the decelerating position is used to begin the deceleration of the mounting head 20 toward the mounting position in the X direction at a suitable timing. The mounting head 20 is communicated with an air suction source via a tube 586.

Figure 21:
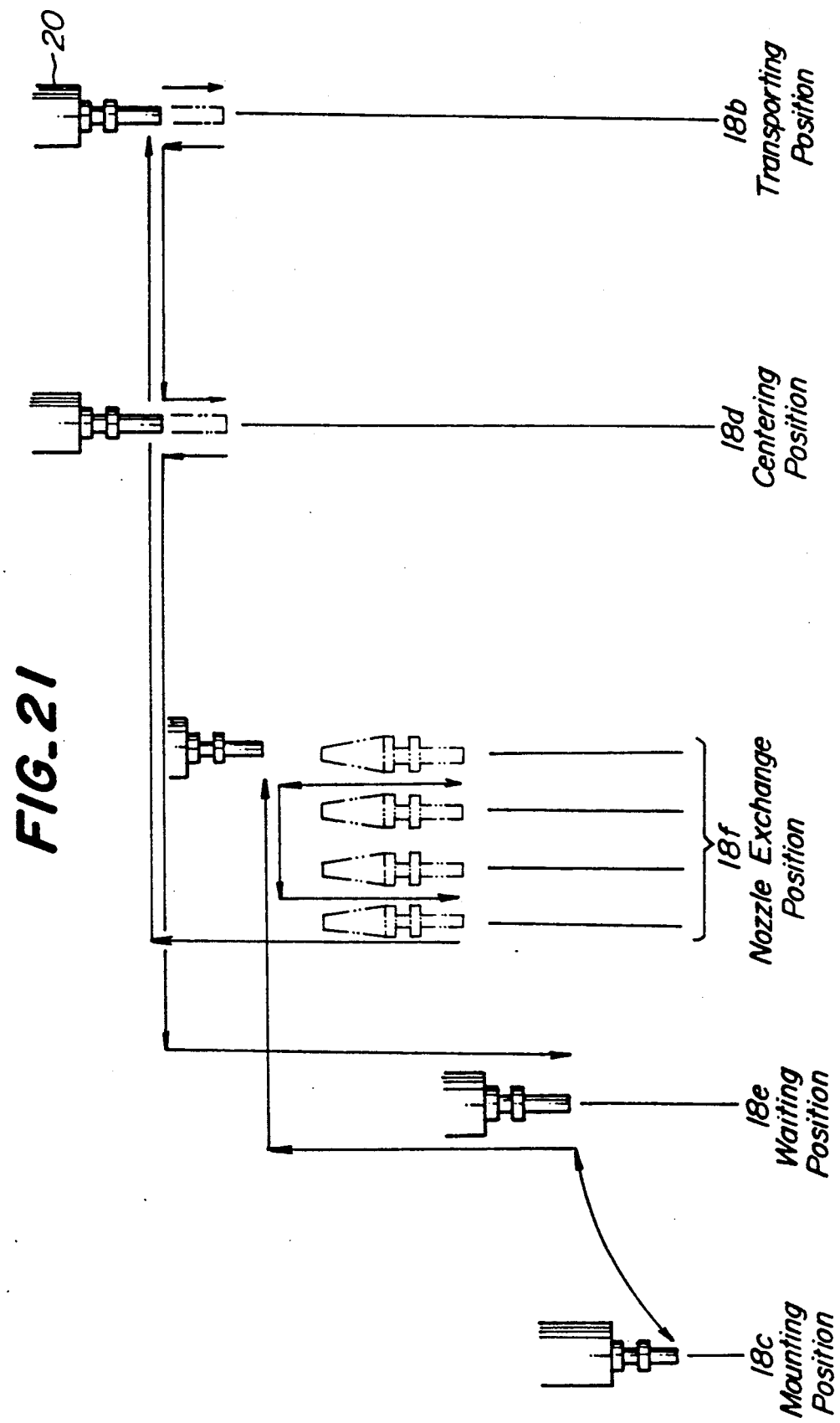
FIG. 21 is a schematic view illustrating the moving path of the mounting head.

FIG. 21 is a schematic view showing the positions of the mounting head 20 in the X and Z directions at respective operational positions. After the chip device has been indexed at the transporting position 18b, the mounting head 20 is moved downward and the chip device is sucked and held at the lower end of the mounting head. Then the mounting head is moved upward and is moved forward in the X direction into the centering position 18d. At the centering position, the mounting head 20 is moved downward and the chip device is inserted into the centering device. After the centering, the mounting head is moved upward and then is moved forward in the X direction into a waiting position 18e. At the waiting position 18e, the mounting head is moved downward. From the waiting position 18e to the mounting position 18c, both the motors 557 and 559 are energized to move the mounting head along a curved path into the mounting position 18c. After the chip device has been mounted on the printed circuit board, the mounting head is returned into the waiting position 18e also along the curved path. At the waiting position 18e, the mounting head is moved upward and then is moved backward in the X direction into a nozzle exchange position 18f. In the present embodiment, there are prepared four suction nozzles any one of which can be selectively secured to the mounting head in accordance with size and dimension of chip devices. When it is required to exchange the suction nozzle, the suction nozzle is first returned into a vacant nozzle receiving position by moving the mounting head up and down, and then after the mounting head is moved into a position above a desired suction nozzle, the mounting head is moved up and down to clamp the relevant suction nozzle into the tip of the mounting head. After the suction nozzle has been exchanged, the mounting head is moved upward and is then moved backward in the X direction into the initial position 18b.

Figure 22A:
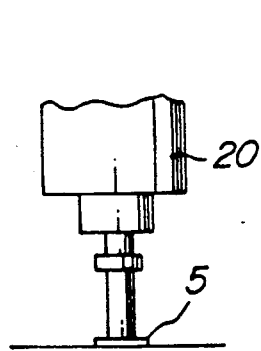
FIGS. 22A to 22C are side views showing the relation between thicknesses of chip devices and descending heights of the mounting head.
Figure 22B:
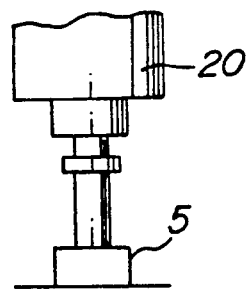
Figure 22C:
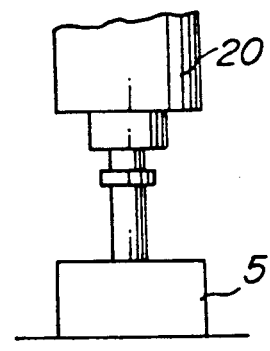

As explained above, in the present embodiment the mounting head 20 can be moved up and down precisely by means of the pulse motor 557, and therefore the lowermost position of the suction nozzle can be changed in accordance with the thickness of chip devices 5 as illustrated in FIGS. 22A to 22C. The information about the thicknesses of chip devices may be previously entered together with the kinds of chip devices. By changing the amount that the mounting head descends in accordance with the thickness of chip devices, it is possible to keep the mounting pressure substantially uniform.

Figure 23A:
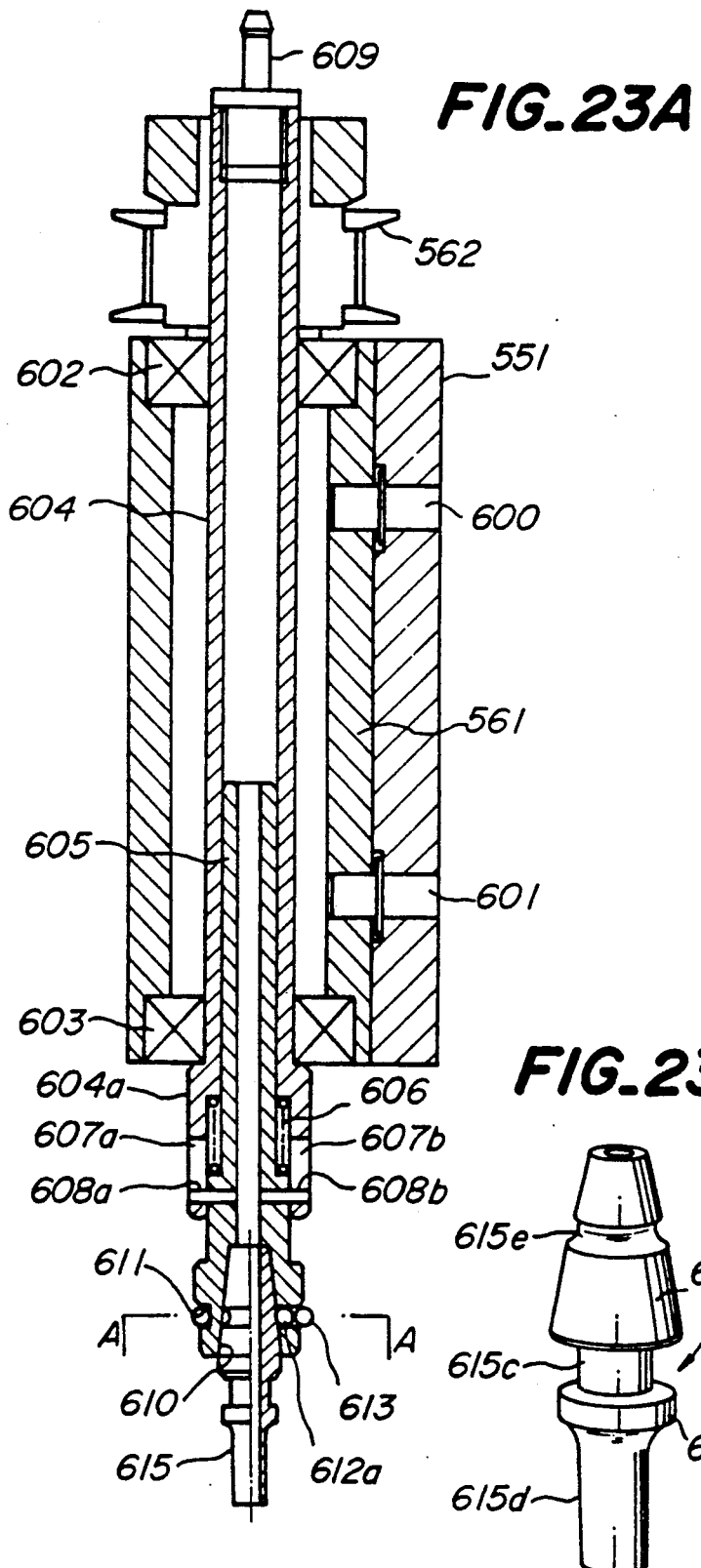
FIGS. 23A and 23B are cross sectional and perspective views, respectively showing the construction of the mounting head and suction nozzle.
Figure 23B:
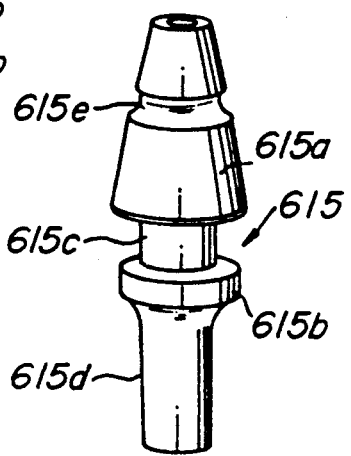

FIGS. 23A and 23B show the detailed construction of the mounting head and suction nozzle. Bearings 60 and 603 are arranged between the mounting head 20 and the box 561 which is secured to the arm 551 by means of pins 600 and 601. The mounting head 20 comprises outer sleeve 604 and inner sleeve 605 slidably inserted into the outer sleeve. In the lower end of outer sleeve 604 there is formed an expanded portion 604a within which is arranged a coiled spring 606 so that the inner sleeve is biased downward. In the expanded portion 604a there are formed elongated recesses 607a and 607b extending in the axial direction, and pins 608a and 608b secured to the inner sleeve 605 are projected through the recesses 607a and 607b, respectively. Therefore, the inner sleeve 605 can be moved up and down with respect to the outer sleeve 604, but cannot be rotated with respect to the outer sleeve.

Figure 24:
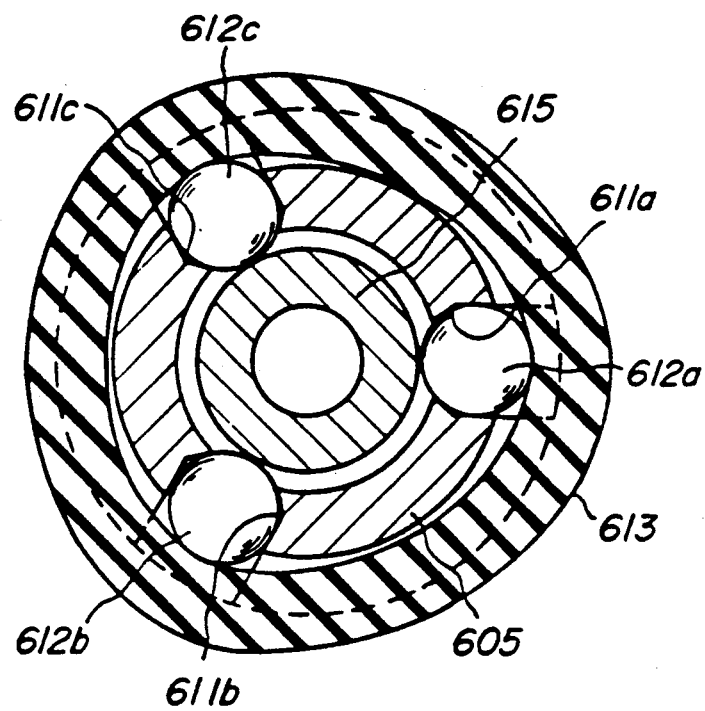
FIG. 24 is a cross sectional view cut along line A—A in FIG. 23A.

In the tip end of the outer sleeve 644 is inserted a nip 609 to which is connected the tube 586 shown in FIG. 20B. In the lower end of inner sleeve 605 there is formed a tapered hole 610 which is expanded downward. On an outer surface of the lower end of inner sleeve 605 there is formed a ring-like recess 611. FIG. 24 is a cross sectional view cut along line A—A in FIG. 23A. In the bottom of the recess 611 there are formed three holes 611a~611c which are communicated with the tapered hole 610 and are separated from each other in the circumferential direction by 120°. Steel balls 612a to 612c are inserted into the holes 611a to 611c, respectively in such a manner that parts of the balls protrude into the tapered hole 610. An O-ring 613 made of elastic material is clamped in the recess 611 so that the balls are maintained in position. As best shown in FIG. 23B, the suction nozzle 615 comprises a tapered portion 615a corresponding to the tapered hole 610, a small diameter portion 615c formed between the lower end of the tapered portion 615a and a flange portion 615b, a nozzle tip portion 615d and a recess 615e formed in the outer surface of the tapered portion 615a. When the suction nozzle 615 has been inserted into the lower end of the inner sleeve 605, the balls 612a to 612c partially project into the recess 615e of the suction nozzle 615 and thus, the nozzle is effectively prevented from being removed from the mounting head 20.

Now the nozzle exchange mechanism will be explained.

FIG. 25 is a perspective view showing schematically the principal construction of the nozzle exchange device. In the present embodiment, an operation plate 620 is driven by an air cylinder 621 such that a front edge of the operation plate is projected into the small diameter portion 615c of the suction nozzle 615, and then the mounting head 20 is moved upward to remove the suction nozzle 615 from the mounting head 20 due to the engagement of the plate 620 with the flange portion 615b. The suction nozzle 615 may be secured to the mounting head 20 by moving the head downward, while the operation plate 620 is clamped into the small diameter portion 615c of the nozzle 615.

Figure 26A:
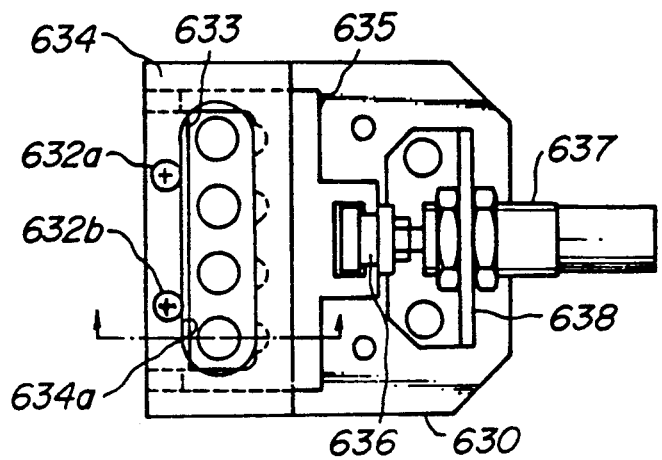
FIGS. 26A to 26E illustrate the detailed construction of the nozzle exchange device.
Figure 26B:
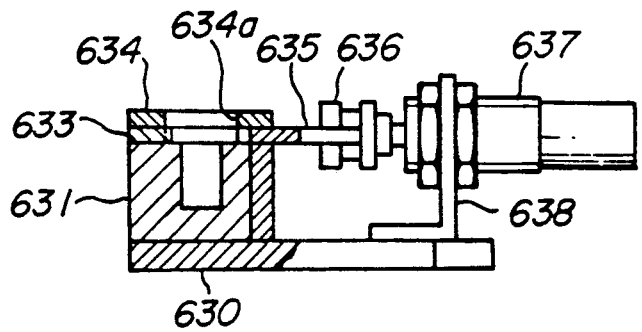
Figure 26C:
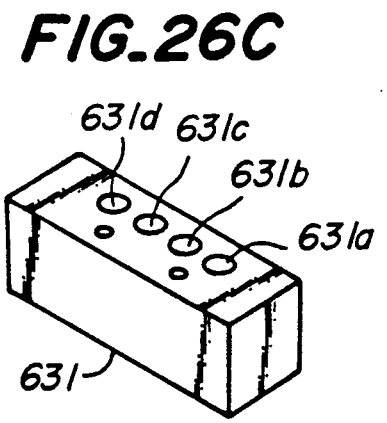
Figure 26D:
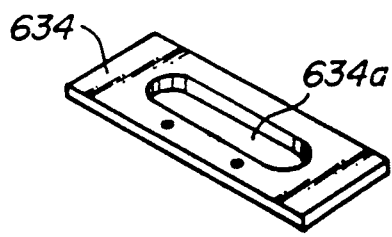
Figure 26E:
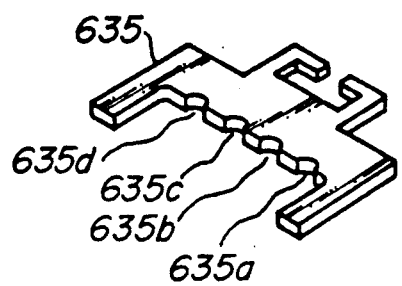
Figure 27A:
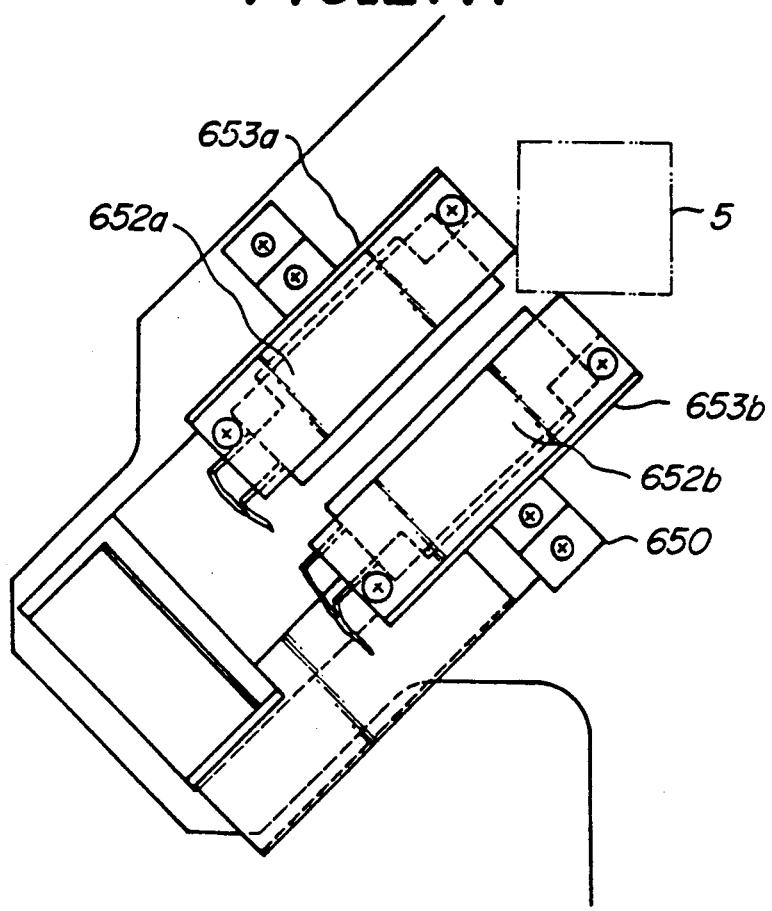
FIGS. 27A to 27D depict the construction of the image information extracting device.
Figure 27B:
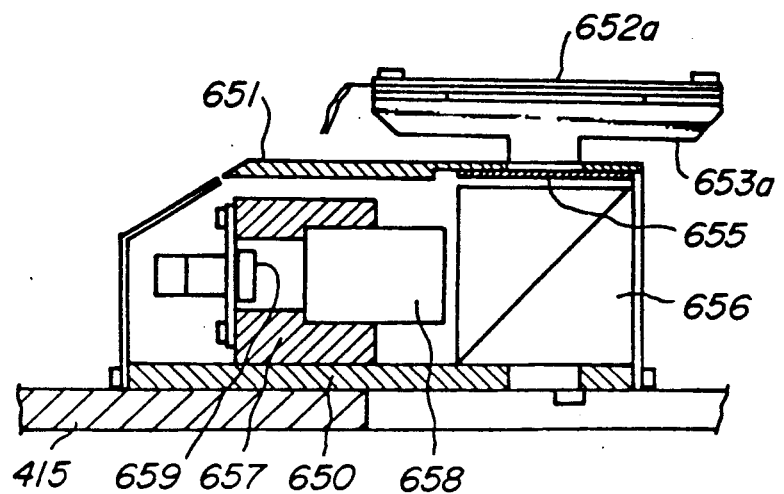
Figure 27C:
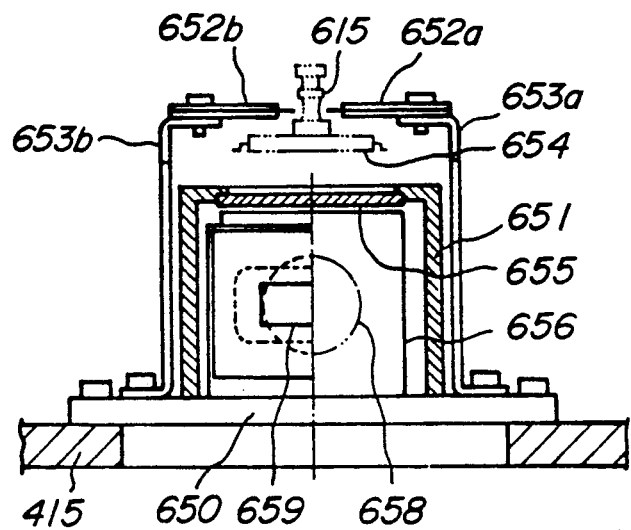
Figure 27D:
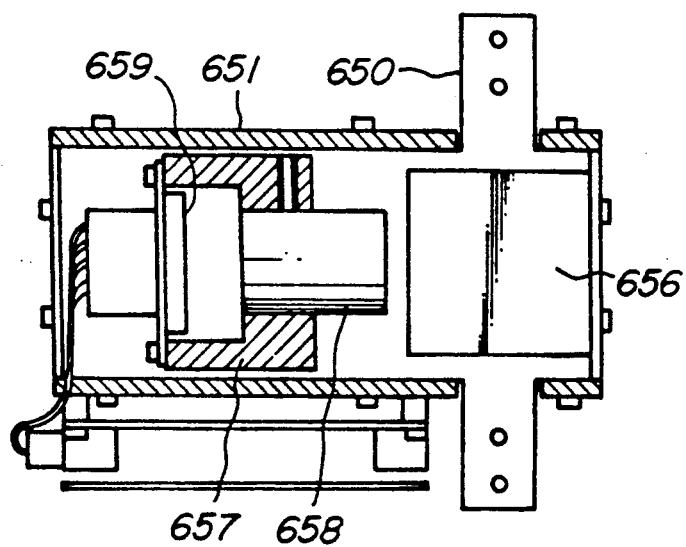

FIGS. 26A to 26E show the detailed construction of the nozzle exchange device. The nozzle exchange device comprises a base 630 to which a block 631 is secured by bolts 632a, 632b, the block having four nozzle containing holes 631a to 631d formed therein. On the block 631 is secured an upper plate 634 via a spacer 633. As illustrated in FIG. 26D, the upper plate 634 has formed therein an elongated hole 634a which surrounds all the nozzle containing holes 631a to 631d. Between a space formed by the spacer 633 between the upper surface of block 631 and the upper plate 634, an operation plate 635 having the construction shown in FIG. 26E is slidably arranged. In one edge of the operation plate 635, there are formed four semicircular recesses 635a to 635d each corresponding to respective nozzle containing holes 631a to 631d. The other edge of the operation plate 635 is connected via a coupling 636 to a driving shaft 637a of an air cylinder 637 including a returning spring. The cylinder 637 is supported by the base 630 by means of an L-shaped bracket 638. By driving the air cylinder 637, it is possible to extrude the operation plate 635 into the nozzle containing holes 631a to 631d of the block 631. By operating the air cylinder 637 and mounting head 20 in a cooperative manner as explained above with reference to FIG. 25, any desired suction nozzle can be detachably secured to the mounting head.

Image Information Extracting Unit

As explained hereinbefore, in the present embodiment, one mounting unit among the four mounting units can treat QFP. In this mounting unit, there is not provided the mechanical centering device shown in FIG. 17. In order to correct the position and posture of QFP, the image information of QFP held by the mounting head is extracted and processed to detect the position and posture of QFP. An error in the position of QFP in the X and Y directions is compensated for by adjusting a position of the XY table supporting the printed circuit board, and an error in the posture is corrected by rotating the mounting head. Now the image information extracting or picking up unit will be explained.

FIGS. 27A, 27B, 27C and 27D are plan view, longitudinal cross sectional view, lateral cross sectional view and bottom view, respectively illustrating the image information extracting unit. To the base 415 is secured a base 650 on which is provided a housing 651. An upper surface of the housing 651 is partially opened, and above the opening there is arranged a pair of electroluminescent (EL) lamps 652a and 652b with the aid of fitting members 653a and 653b, respectively. These EL lamps 652a and 652b are separated from each other to form an elongated space therebetween, through which the suction nozzle 615 holding QFP 654 can move horizontally. In the opening of the housing 651 there is clamped infrared cut filter 655 and below the filter there is arranged a prism 656 for bending an optical axis at right angles, the prism 656 being secured onto the base 650. On the base 650 there are further provided an imaging lens 658 and an image pick up device 659 composed of CCD line sensor by means of a holder 657.

When the QFP 654 held by the suction nozzle 615 passes underneath the EL lamps 652a and 652b, light rays which are not shielded by the QFP are made incident upon the image pick-up device 659 via the filter 655, prism 656 and lens 658. In this manner, the negative image of the QFP 654 is picked u by the device 659 to derive the image information of the QFP held on the mounting head.

QFP Supply Unit

Figure 28:
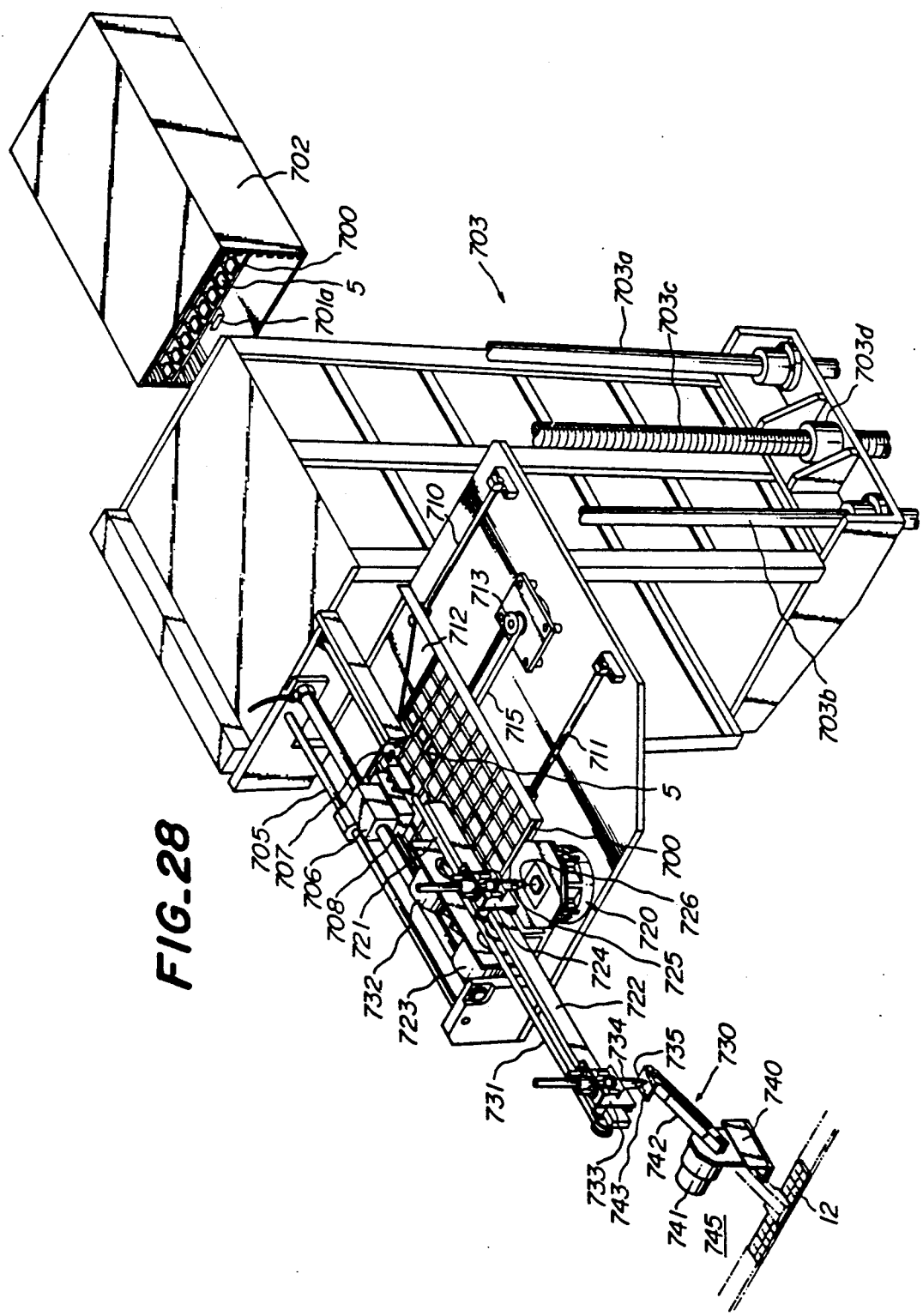
FIG. 28 is a perspective view showing the QFP supply unit.
Figure 32A:
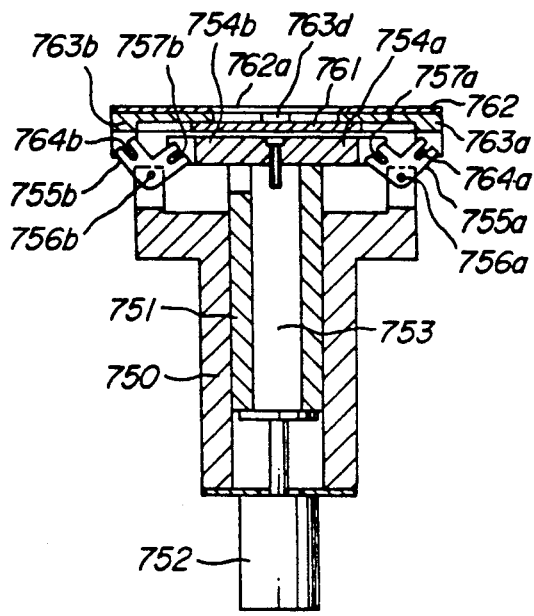
FIGS. 32A to 32D show the QFP centering device.
Figure 32C:
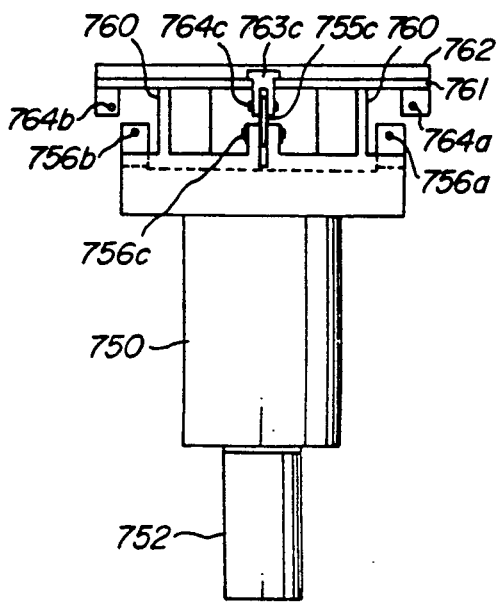
Figure 32B:
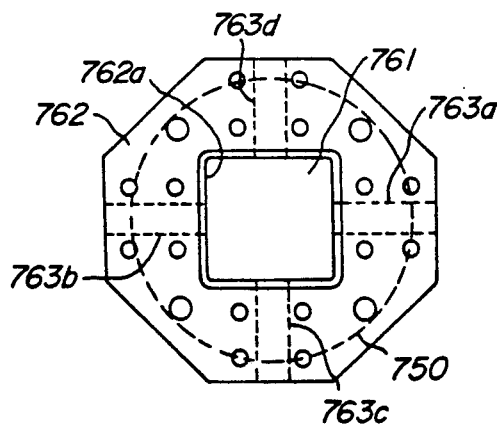
Figure 32D:
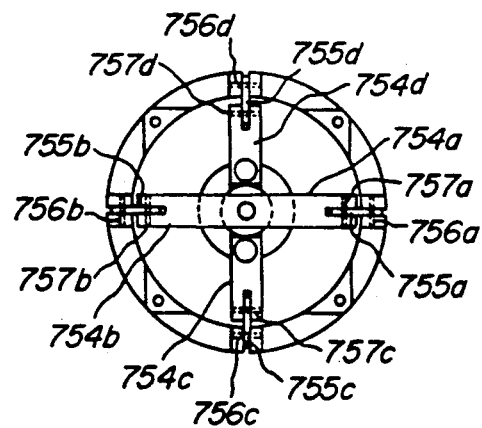

FIG. 28 is a perspective view illustrating the QFP supply unit and FIGS. 29A and 29B are plan and side views, respectively showing the QFP supply unit. A number of QFPs 5 are arranged in matrix on trays 700. As shown in FIG. 30, QFPs 5 may be contained in a small tray 700 and the tray may be arranged on a pallet 701 having the same configuration a the usual tray 700. In such a case, various kinds of trays may be used. Ten trays 700 or pallets 701 containing QFPs of the same kind are detachably arranged in a stocker 702 as shown in FIG. 31. In inner surfaces of side walls of the stocker 702 are formed recesses for receiving the trays. Five stockers 702a~702e each including ten trays or pallets are arranged in a lift device 703. The lift device 703 comprises a pair of guide rods 703a,703b, screw 703c, nut 703d and induction motor 704 coupled with the screw 703c. By energizing the induction motor 704, the stockers 702a~702e can be moved up and down through a tray supply position.

In order to remove a tray 700 or pallet 701 indexed at the tray supply position by the lift device 703, there is provided a tray feeding device. The tray feeding device comprises guide rod 705 extending horizontally in the X direction, air cylinder 706 arranged in parallel with the guide rod 705, hook 707 which may be engaged with a lag 701a provided at a front edge of a tray or pallet, and actuator 708 for moving the hook horizontally, the actuator being coupled with a plunger of the air cylinder 706 and being guided by the guide rod 705 movably in the X direction. By driving the air cylinder 706, the hook 707 and actuator 708 are moved into the lift device 703. Then, the actuator 708 is driven to project the hook 707 into the lag 701a of tray 700 or pallet 701. Then the air cylinder 706 is driven again to move the hook 707 together with the tray or pallet into the original position. Finally, the actuator 708 is driven to disengage the hook 707 from the lag 701a. Then the tray 701 can be freely moved without being interrupted by the hook. In this manner, a given tray or pallet is removed from the lift device 703 and is indexed into a given position on an Y table 712 placed on guides 710, 711 extending in a Y direction perpendicular to the X direction. The Y table 712 is secured to an endless belt 715 provided between pulleys 713 and 714. Therefore, by rotating the belt 715 by means of a motor 715a, the Y table 712 can be moved in the Y direction along the guides 710, 711.

There is further provided a first feeding device for feeding a QFP 5 contained in the tray 700 or pallet 701 into a simple centering device 720. This first feeding device comprises endless belt 721 and guide rod 722 both extending in the X direction, pulse motor 723 for rotating the endless belt 721, frame 724 secured to the belt 721 and slidably supported by the guide rod 722, arm 725 secured to the frame 724 movably up and down and suction nozzle 726 provided at a lower end of the arm 725. When the pulse motor 723 is energized to rotate the endless belt 721, the frame 724 is moved in the X direction such that the suction nozzle 726 comes into a position just above a desired QFP 5 to be supplied. Then the arm 725 is moved downward and the QFP is sucked onto the nozzle 726. Then after the arm 725 has been moved upward, the pulse motor 723 is energized again to feed the QFP 5 into a position above the simple centering device 720. Next, the arm 725 is moved downward and the suction force is weakened to place the QFP 5 on the simple centering device. The simple centering device 720 effects the centering of QFP 5 in the X and Y directions as will be explained later. Then the QFP 5 is transferred from the simple centering device 720 to a turnover device 730. This transferring is carried out by a second X direction feeding device. The second feeding device comprises endless belt 731 extending in the X direction, pulse motor 732 for rotating the endless belt 731, frame 733 secured to the endless belt 731 and being slidably supported by the guide rod 722, arm 734 secured to the frame 733 movably up and down, and suction nozzle 735 secured to the tip of the arm 734. Since operation of the second feeding device is identical with that of the first feeding device, its explanation has been omitted.

The QFP 5 sucked onto the suction nozzle 735 of the second feeding device is fed into a position above the turnover device 730. Then, the arm 734 is moved downward and the QFP 5 is transferred to the suction nozzle provided at a tip of arm of the turnover device.

FIG. 28 illustrates the construction of the turnover device 730. The turnover device 730 comprises stand 740, motor 741 provided on the stand, arm 742 secured to an output shaft of the motor 741, and suction nozzle 743 provided at a free end of the arm. The QFP supply unit has to be placed at any desired position on the mounting unit, and thus a permanent magnet is provided on the stand 740 and a table 745 of the mounting unit is made of magnetic material such as iron. After the QFP 5 has been transferred onto the nozzle 743 of the turnover device 730, the arm 742 is rotated by 180° to transfer the QFP onto a carrier 12. On the carrier 12, the QFP 5 is held in the upside down fashion.

After all QFPs 5 on the tray 700 have been supplied or when one or more QFPs of the different kinds of QFPs have to be supplied, the table 712 is returned into the origin and then the tray is returned into the lift device 703 by means of the X direction feeding device. Then, the motor 704 is energized to feed a given tray 700 or pallet 701 into the supply position. In this manner, desired QFPs can be successively supplied.

QFP Centering Unit

FIGS. 32A to 32D show the construction of the simple centering unit for QFP. The centering unit comprises a cylindrical main body 750 and an inner sleeve 751 arranged slidably within the main body. The lower end of inner sleeve 751 is connected to a cylinder 752. In the inner sleeve 751, a weight color 753 is inserted, and arms 754a to 754d are secured to the upper end of weight color, the arms extending in mutually orthogonal directions to form a cross. In free ends of each arms 754a to 754d are formed recesses in which one end of L-shaped links 755a to 755d are inserted. The links 755a to 755d are journalled by pins 756a to 756d, respectively secured to the main body 750. In the ends of the links 755a to 755d inserted in the recesses of arms 754a to 754d there are formed recesses through which pins 757a to 757d, respectively are passed. On an upper surface of main body 750 there is integrally formed posts 760 by means of which an intermediate plate 761 and upper plate 762 are supported. These plates 761 and 762 constitute a guide for supporting four slide plates 763a to 763d slidably in the radial direction. In the upper plate 762 there is formed a square opening 762a through which the intermediate plate 761 is partially exposed. On the slide plates 763a to 763d there are secured pins 764a to 764d which are inserted into recesses formed in the other ends of links 755a to 755d.

Now the operation of the centering device will be explained. When the QFP 5 held on the nozzle 726 of the first feeding device is transferred to the centering unit, the cylinder 752 is energized, so that the inner sleeve 751 is in the upper position and the slide plates 763a to 763d are retarded outwardly. After the QFP 5 has been placed on the intermediate plate 761 via the opening 762a, the cylinder 754 is deenergized to move the inner sleeve 751 and weight color 753 downward due to the gravitational force. Then, the links 755a to 755d are rotated and the slide plates 763a to 763d are simultaneously moved toward the center of the opening 762a. During this movement, the slide plates 763a to 763d are brought into contact with the QFP 5 to effect the centering. After the centering, the inner sleeve 751 and weight color 753 are moved upward by actuating the air cylinder 752 to move the slide plates 763a to 763d outwardly. In this manner, in the present embodiment, the centering can be performed simultaneously both in the X and Y directions.

The present invention is not limited to the embodiments explained above, but many modifications and alternations may be conceived by those skilled in the art within the scope of the invention. In the above embodiment the carriers are secured to the chain, but they may be connected to other driving members such as a timing belt. Further, it is not always necessary to rotate the mounting head at any desired angle, but it may be indexed into three angular positions, i.e. 0° and ±45°.

As explained above in detail, in the automatic chip mounter according to the invention desired chip devices provided in a number of tape units are supplied in a predetermined order onto carriers in the upside down fashion and are held on the carriers with the aid of the suction force. Then the chip devices are successively fed into the transporting position to the turnover device which holds the chip device and turns over the chip device. Then the turned over chip device, i.e. correctly oriented chip device is transferred to the mounting head. At the same time, the printed circuit board arranged on the XY table is indexed with respect to the mounting position. Then the mounting head is moved downward to mount the chip device on the circuit board. In this manner, the chip devices can be mounted on the circuit board in a prompt and positive manner, while the tape unit mounting unit, feeding unit, turnover unit and mounting head can be made of a small and simple construction.

Further, even if the chip device includes pins extending downward from side edges such as QFP, the chip device can be positively held on the carrier, because the chip device is placed on the carrier in the upside down fashion. Further, during transportation of the chip device, it is hardly deviated on or dropped from the carrier.

In this manner, with the aid of the automatic chip mounter according to the invention, various kinds of chip devices having different sizes and shapes can be mounted on the printed circuit board in a positive and speedy manner, so that the mounting rate can be highly increased. Further, the whole apparatus can be made simple in construction, small in size and cheap in cost.

What is claimed is:

1. A centering device for centering an article held on a surface by suction, said centering device being supported adjacent to said surface and comprising a first centering means including:
   a first slide plate having two parallel leg portions each having a rack gear, said first slide plate having a third leg portion having an upright portion at a free end thereof;
   pinion gears for engaging said rack gears on said first slide plate;
   a second slide plate having rack gears on two parallel edges thereof for engaging said pinion gears and an upright portion at a free end thereof; and
   driving means for driving said first slide plate and said second slide plate in opposite directions, whereby an article held on a surface is clamped between the upright portions on said first and second slide plates when said first and second slide plates are moved towards each other, and the article is released by the upright portions on said first and second slide plates when said slide plates are moved away from each other.

2. The device as set forth in claim 1, wherein said first slide plate and said second slide plate are movable at the same speed by said driving means.

3. The device as set forth in claim 1, wherein said centering device further comprises a second centering means which overlaps and is perpendicular to said first centering means, said second centering means comprising:
   a third slide plate having two parallel leg portions each having a rack gear and having a third leg portion having an upright portion at a free end thereof;
   second pinion gears for engaging said rack gears on said third slide plate;
   a fourth slide plate having rack gears on two parallel edges thereof for engaging said second pinion gears and an upright portion at a free end thereof, said upright portions on said third and fourth slide plates projecting through an opening in said first centering means; and
   means for driving said third slide plate and said fourth slide plate in opposite directions, whereby an article held on a surface is clamped between said upright portions on said third and fourth slide plates when said third and fourth slide plates are moved towards each other and the article is released by said upright portions on said third and fourth slide plates when said third and fourth slide plates are moved away from each other.

4. A device for centering an article resting on a surface comprising:
   a cylindrical main body;
   an inner sleeve inserted slidably within said main body;
   a support member inserted in said inner sleeve;
   arms attached to an end of said support member extending perpendicularly from an end of said inner sleeve;
   a guide portion including an intermediate plate and an upper plate, said upper plate having an opening therein for exposing part of said intermediate plate;
   slide plates supported by said guide portion, said slide plates being slidably in a radial direction relative to said main body;
   L-shaped links journalled by pins to said main body, each of said L-shaped link having one end journalled by a pin to one of said arms, and having one end journalled by a pin to one of said slide plates; and
   means for driving said inner sleeve, whereby when said sleeve is driven to an upper position, said slide plates are moved outwardly, and when an article is placed on said intermediate plate via said opening in said upper plate, said inner sleeve is moved downward by gravitational force, thereby rotating said links and causing said slide plates to substantially simultaneously move toward the center of said opening and thereby adjust the position of said article in two perpendicular directions on said surface.

* * * * *

UNITED STATES PATENT AND TRADEMARK OFFICE
CERTIFICATE OF CORRECTION

PATENT NO. : 5,135,098

DATED : August 4th, 1992

INVENTOR(S) : Masaaki KOIBUCHI

It is certified that error appears in the above-identified patent and that said Letters Patent is hereby corrected as shown below:

On the title page, correct Item [60] to read:

Related U.S. Application Data

Division of Ser. No. 421,406, Oct. 13, 1989, Pat No. 5,058,721, which is a continuation of Ser. No. 146,010, Jan. 20, 1988, Pat. No. 4,908,092.

Signed and Sealed this

Twenty-first Day of September, 1993

Attest:

BRUCE LEHMAN

*Attesting Officer*    *Commissioner of Patents and Trademarks*